United States Patent
Yosoku et al.

(10) Patent No.: US 9,065,525 B1
(45) Date of Patent: Jun. 23, 2015

(54) RECEIVING APPARATUS

(71) Applicant: Panasonic Corporation, Osaka (JP)

(72) Inventors: Naoya Yosoku, Kanagawa (JP);
Koichiro Tanaka, Kanagawa (JP);
Hiroyuki Motozuka, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/604,869

(22) Filed: Jan. 26, 2015

(30) Foreign Application Priority Data

Feb. 5, 2014 (JP) .................................. 2014-020659

(51) Int. Cl.
| | | |
|---|---|---|
| *H04L 27/06* | (2006.01) | |
| *H04B 1/12* | (2006.01) | |
| *H03F 3/19* | (2006.01) | |
| *H03G 3/30* | (2006.01) | |

(52) U.S. Cl.
CPC .................. *H04B 1/123* (2013.01); *H03F 3/19* (2013.01); *H03G 3/3042* (2013.01); *H03F 2200/451* (2013.01); *H03F 2200/294* (2013.01)

(58) Field of Classification Search
CPC ........ H04B 1/123; H03G 3/3042; H03F 3/19; H03F 2200/294; H03F 2200/451
USPC ........................................................ 375/342
See application file for complete search history.

(56) References Cited

U.S. PATENT DOCUMENTS

| | | | | |
|---|---|---|---|---|
| 4,870,370 A | * | 9/1989 | Hedberg et al. ............... | 330/133 |
| 6,226,504 B1 | * | 5/2001 | Takagi ........................ | 455/234.1 |
| 2007/0066259 A1 | * | 3/2007 | Ryan et al. .................. | 455/234.1 |
| 2007/0076783 A1 | * | 4/2007 | Dishman et al. .............. | 375/136 |
| 2008/0070534 A1 | * | 3/2008 | Lai ............................. | 455/232.1 |
| 2012/0195384 A1 | * | 8/2012 | Sato ............................. | 375/257 |

FOREIGN PATENT DOCUMENTS

JP     2005-278017     10/2005

\* cited by examiner

*Primary Examiner* — Juan A Torres
(74) *Attorney, Agent, or Firm* — Panasonic Patent Center

(57) ABSTRACT

A receiving apparatus receives a signal via a receiving antenna and quantizes the signal. The receiving apparatus includes: a gain control section that adjusts gain in the receiving apparatus in accordance with electric power of the quantized signal; an electric power estimating section that estimates electric power of the signal before quantization of the signal received by the receiving antenna on the basis of the electric power of the quantized signal and the gain in the receiving apparatus; and an error detecting section that detects a reception error in a predetermined region of the quantized signal, and the gain control section adjusts a search range for the gain on the basis of a result of detection of the reception error in the predetermined region of the quantized signal and an electric power estimated value of the signal before quantization of the signal received by the receiving antenna.

8 Claims, 14 Drawing Sheets

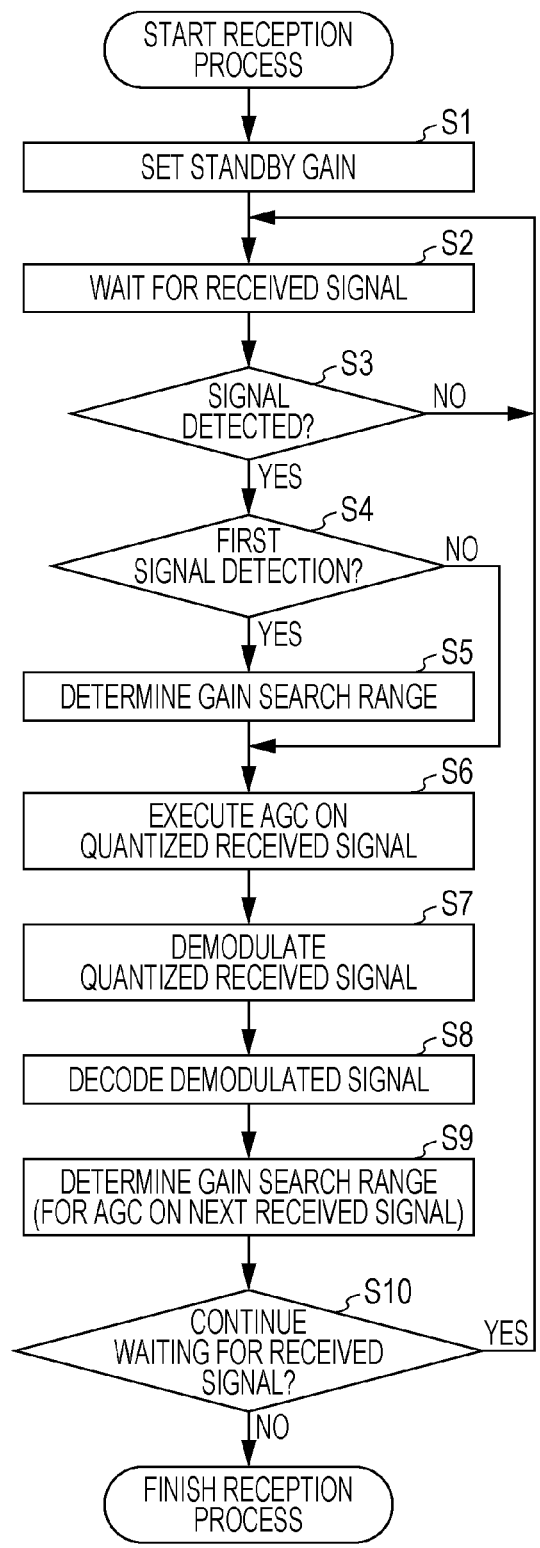

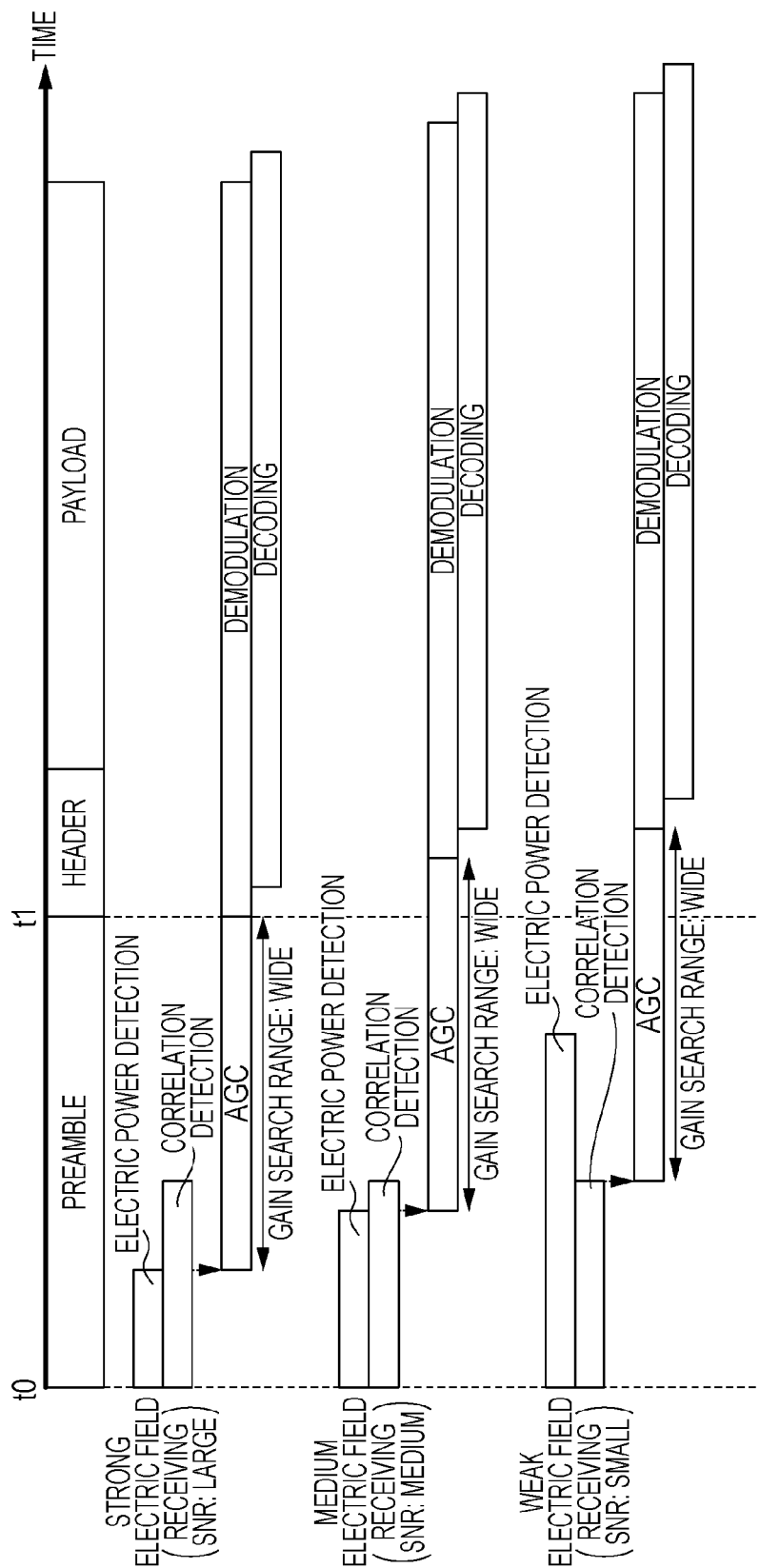

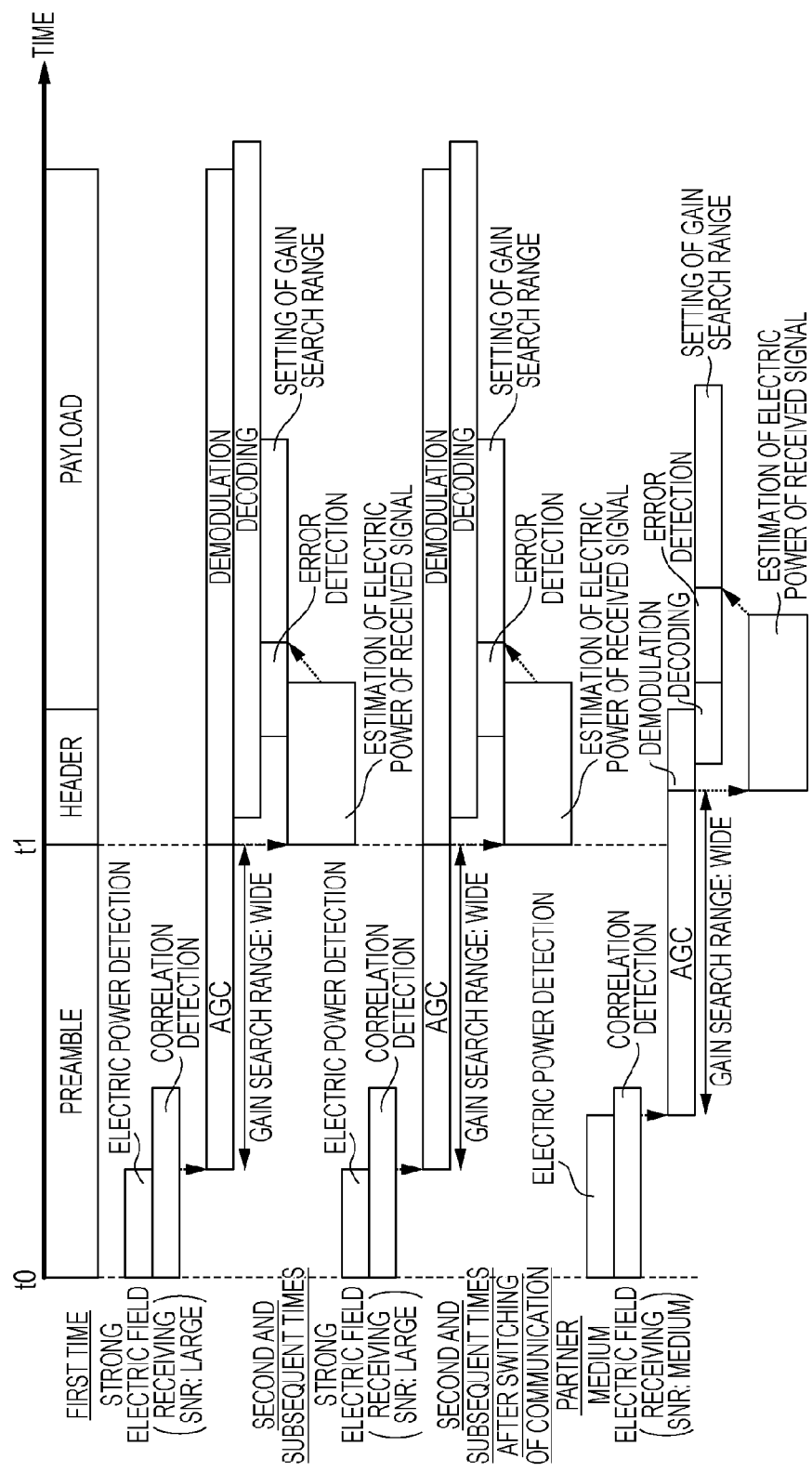

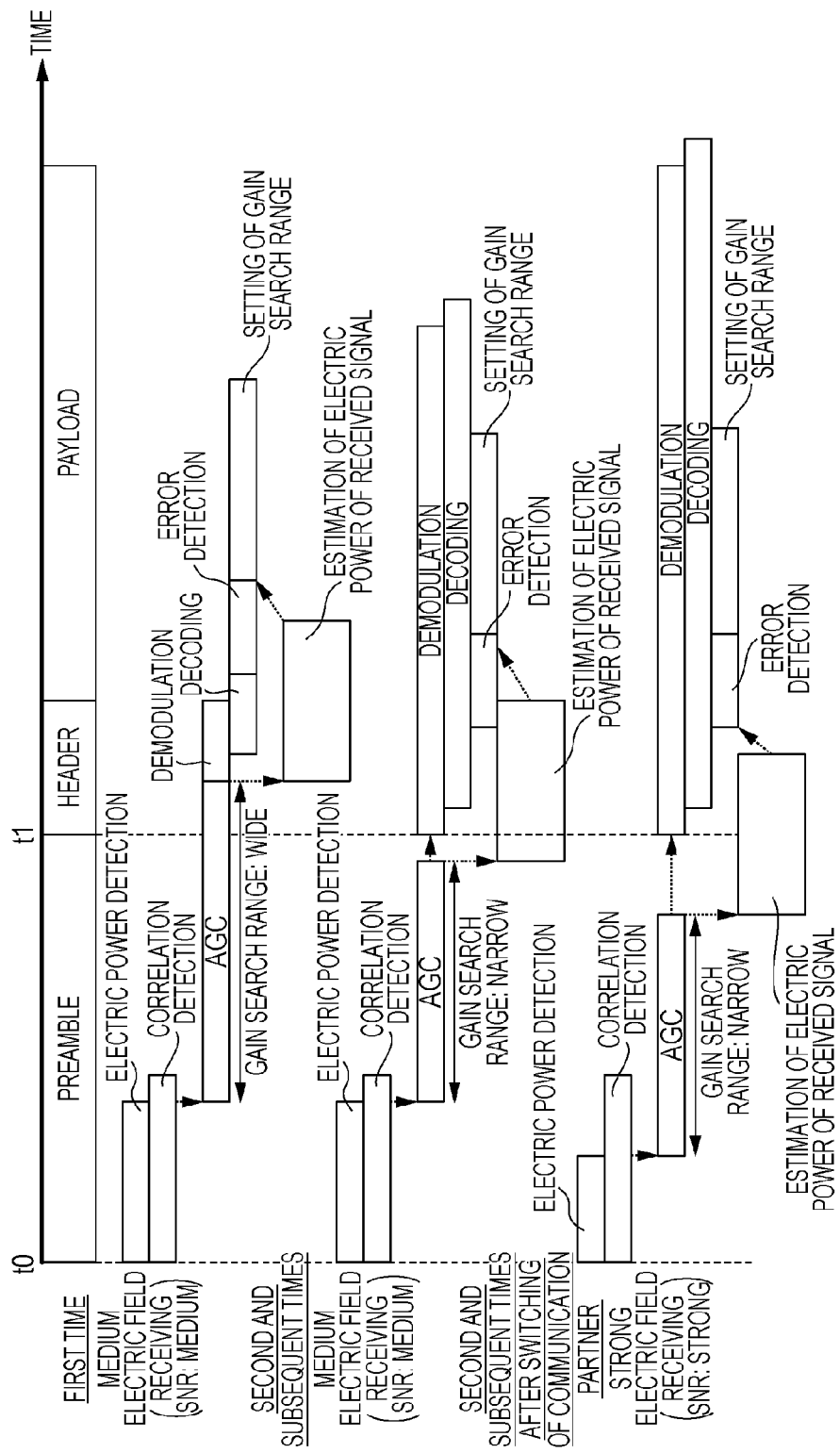

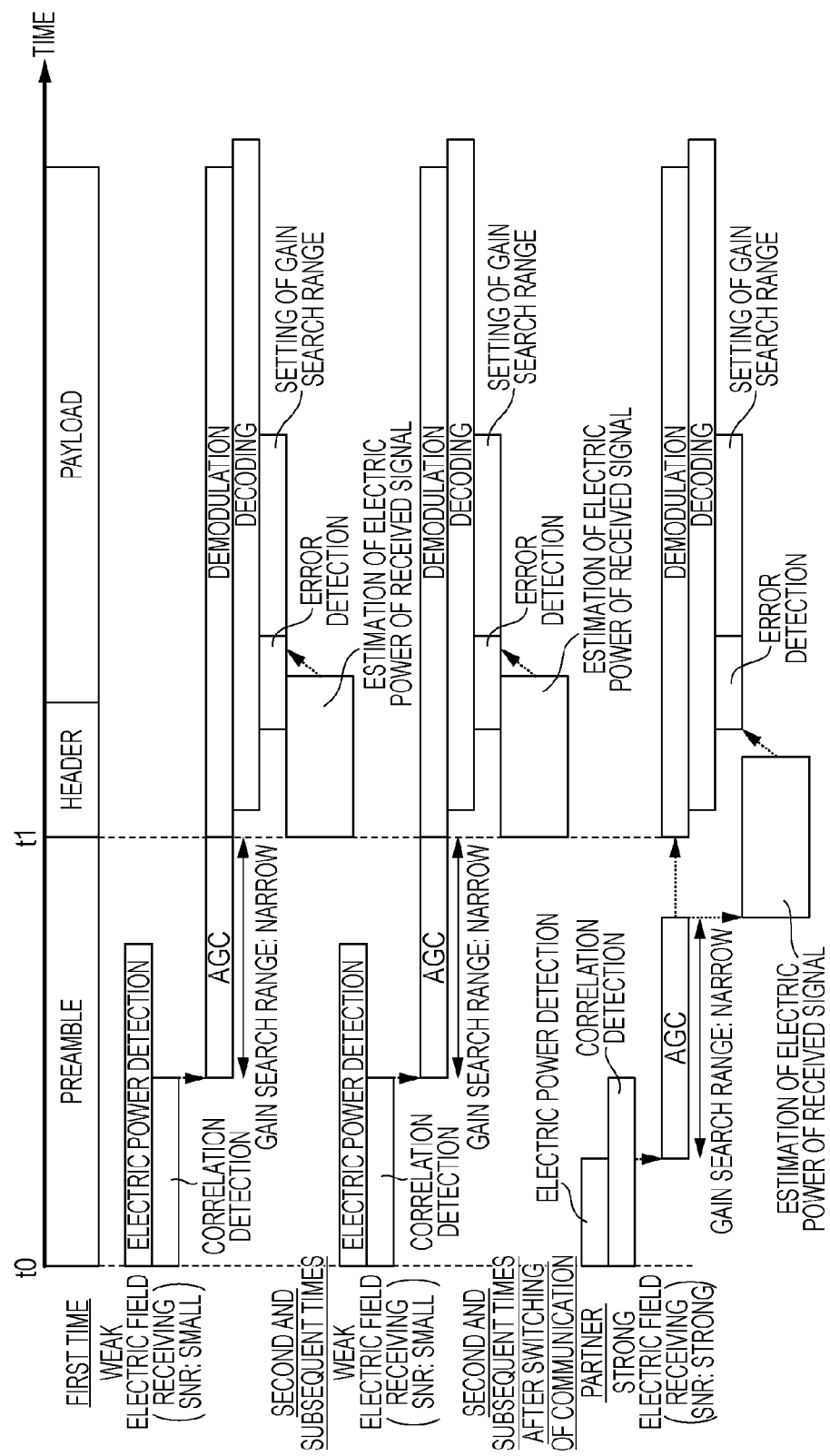

RECEIVING APPARATUS

CROSS REFERENCES TO RELATED APPLICATIONS

This application claims priority to Japanese Patent Application No. 2014-020659, filed on Feb. 5, 2014, the contents of which are hereby incorporated by reference.

BACKGROUND

1. Technical Field

The present disclosure relates to a receiving apparatus that controls gain in accordance with electric power of a received signal.

2. Description of the Related Art

Standardization of a communication standard of wireless LAN (Local Area Network) such as IEEE (The Institute of Electrical and Electronics Engineering, Inc.) 802.11ad is in progress. IEEE802.11ad employs an access control method called CSMA/CA (Carrier Sense Multiple Access/Collision Avoidance).

In CSMA/CA, a receiving apparatus detects a signal present in a wireless transmission path and adjusts gain for amplifying the detected signal so that a band of fluctuation of the detected signal falls within a dynamic range of an ADC (Analog Digital Converter). In IEEE802.11ad, a training sequence called a preamble is provided at the start of a packet, and a receiving apparatus executes automatic gain control (AGC) by using the preamble.

As a technique for rapidly converging AGC in a restricted preamble section, for example, Japanese Unexamined Patent Application Publication No. 2005-278017 is known. A wireless communication device described in Japanese Unexamined Patent Application Publication No. 2005-278017 stores an optimum AGC gain value of a past communication and sets the stored gain value as a standby gain value for each AGC circuit during a standby period, thereby shortening a convergence time needed before determining an optimum gain value at the restart of communication.

SUMMARY

In Japanese Unexamined Patent Application Publication No. 2005-278017, in a case where the wireless communication device communicates with a terminal (referred to as a "terminal A" for convenience of description) that is close to the wireless communication device and a terminal (referred to as a "terminal B" for convenience of description) that is remote from the wireless communication device, an AGC gain value during communication with the terminal A converges to a small gain value because of a short distance.

However, when the AGC gain value that has converged during the communication with the terminal A is set as a standby gain value, convergence of AGC takes time, and demodulation of a signal from the remote terminal B is delayed because of the small standby gain in the wireless communication device. This undesirably deteriorates the accuracy of signal detection. Moreover, the standby gain in the wireless communication device also becomes unsuitable when the terminal A is moved. Therefore, similarly, convergence of AGC takes time, and demodulation of a signal is delayed, thereby deteriorating the accuracy of signal detection.

One non-limiting and exemplary embodiment provides a receiving apparatus that suppress deterioration of the accuracy of detection of a received signal by increasing the speed of convergence of AGC irrespective of a change of a communication partner or movement of a communication partner.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

In one general aspect, the techniques disclosed here feature a receiving apparatus that receives a signal via a receiving antenna and quantizes the received signal, including: a gain controller that adjusts gain in the receiving apparatus in accordance with electric power of the quantized received signal; an electric power estimator that estimates electric power of the received signal before quantization on the basis of the electric power of the quantized received signal and the gain in the receiving apparatus; and an error detector that detects a reception error of a predetermined region of the quantized received signal, wherein the gain controller adjusts a search range for the gain on the basis of a result of detection of the reception error of the predetermined region of the quantized received signal and an electric power estimated value of the received signal before quantization.

These general and specific aspects may be implemented using a system, a method, and a computer program, and any combination of systems, method, and computer programs.

According to the receiving apparatus according to the present disclosure, it is possible to suppress a deterioration of the accuracy of detection of a received signal by increasing the speed of convergence of AGC irrespective of change or movement of a communication partner.

BRIEF DESCRIPTION OF THE DRAWINGS

FIG. 5 is a flow chart for explaining an example of an overall operation procedure of a reception process in the receiving apparatus of the present embodiment;

FIG. 11 is a timing chart illustrating signal detection operations in the cases of a strong electric field, a medium electric field, and a weak electric field in a chronological order in a conventional art;

FIG. 12 is a timing chart illustrating a signal detection operation in the case of a strong electric field in a chronological order in the receiving apparatus of the present embodiment;

FIG. 13 is a timing chart illustrating a signal detection operation in the case of a medium electric field in a chronological order in the receiving apparatus of the present embodiment; and FIG. 14 is a timing chart illustrating a signal detection operation in the case of a weak electric field in a chronological order in the receiving apparatus of the present embodiment.

DETAILED DESCRIPTION

An embodiment (hereinafter referred to as the "present embodiment") of a receiving apparatus according to the present disclosure is described below with reference to the drawings. The receiving apparatus of the present embodiment is an information communication terminal that supports a communication standard (e.g., IEEE802.11ad) for wireless LAN and is, for example, a smartphone or a tablet PC. Note, however, that the receiving apparatus of the present embodiment is not limited to a smartphone or a tablet PC.

Figure 1:
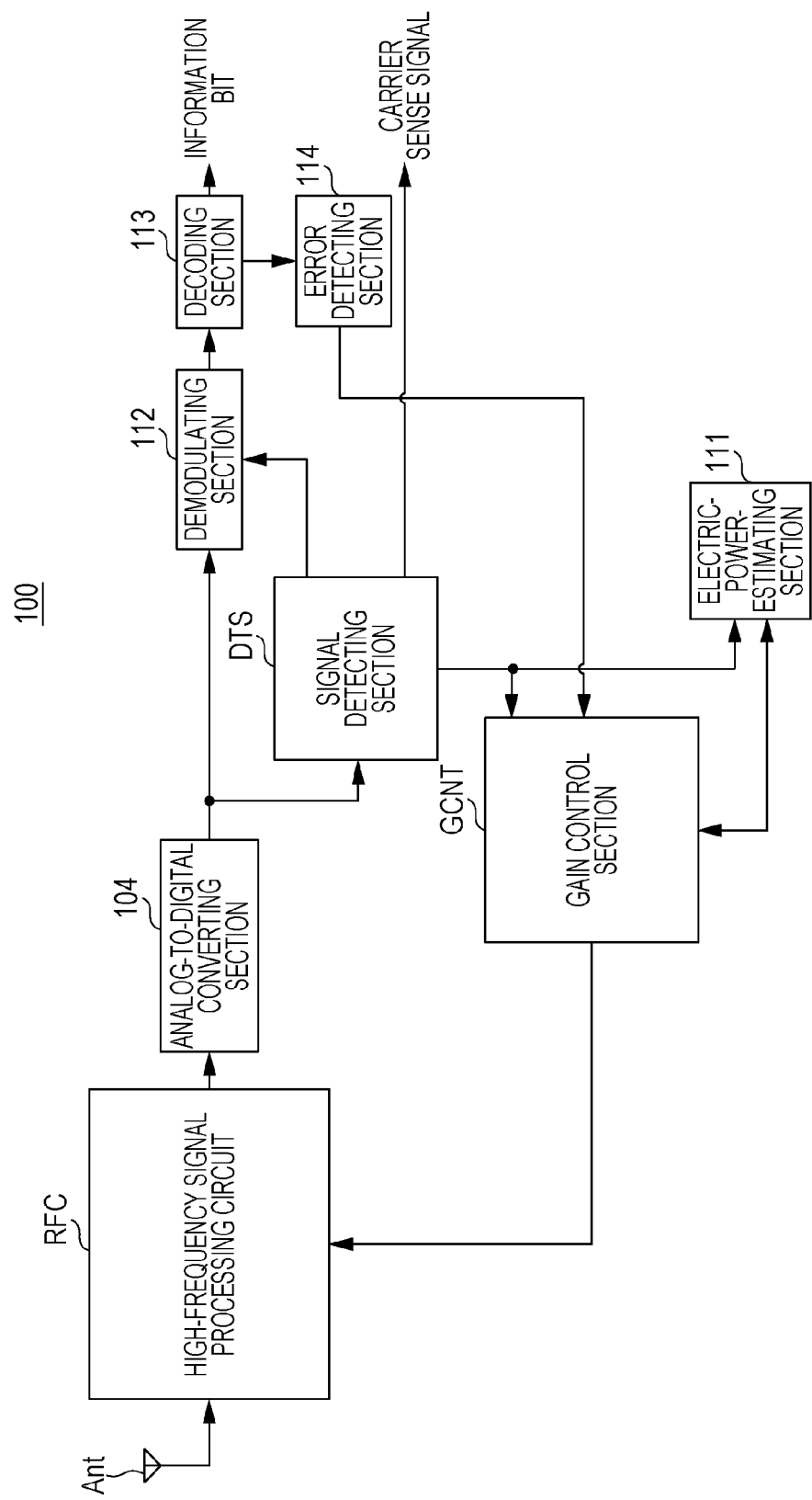
FIG. 1 is a block diagram schematically illustrating an internal configuration of a receiving apparatus of the present embodiment.
Figure 2:
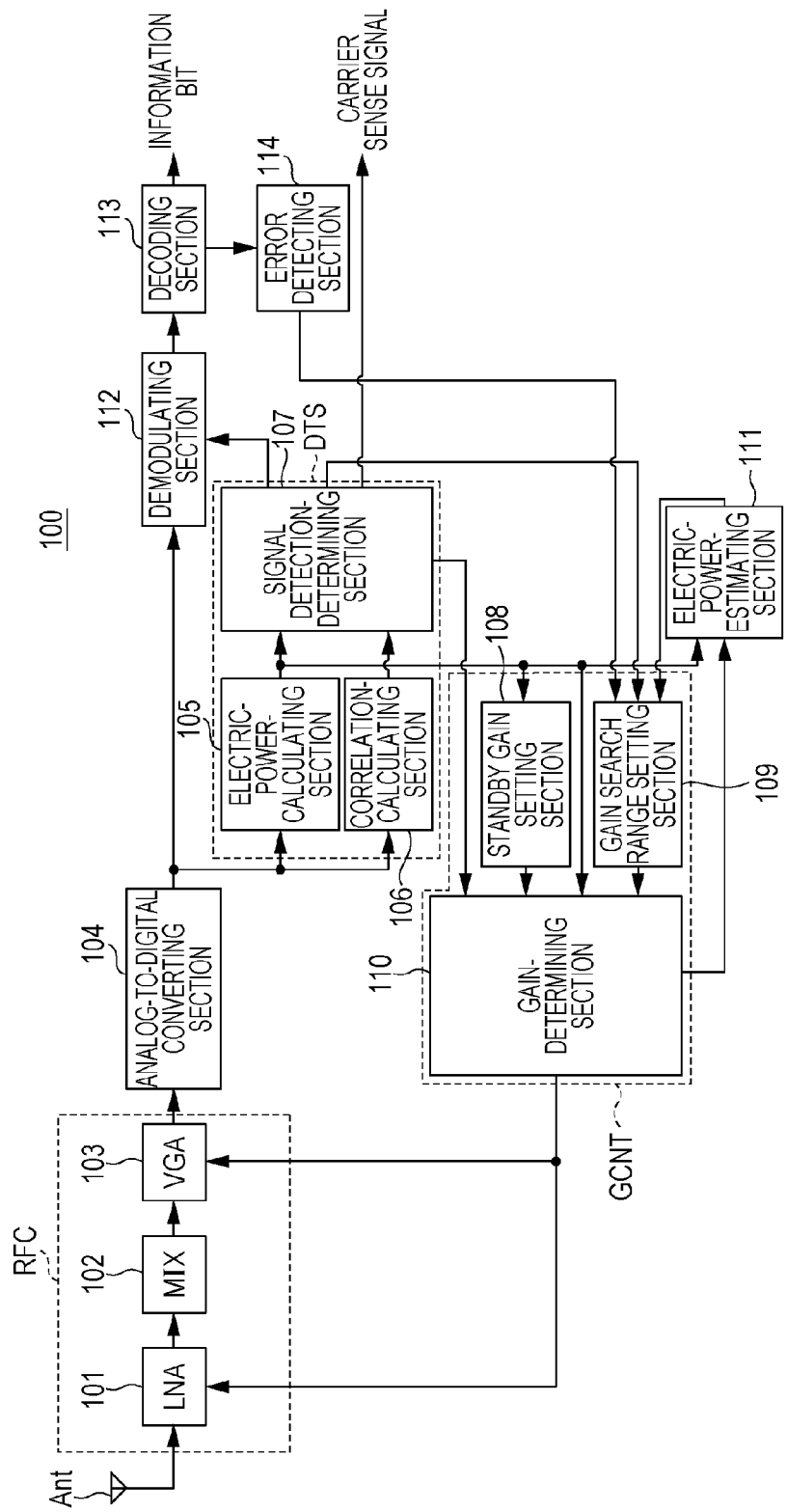
FIG. 2 is a block diagram illustrating in details the internal configuration of the receiving apparatus of the present embodiment.

FIG. 1 is a block diagram schematically illustrating an internal configuration of a receiving apparatus 100 of the present embodiment. FIG. 2 is a block diagram schematically illustrating an internal configuration of the receiving apparatus 100 of the present embodiment. The receiving apparatus 100 illustrated in FIG. 1 includes a high-frequency signal processing circuit RFC to which a receiving antenna Ant is connected, an analog-to-digital converting section 104, a signal-detecting section DTS, a gain control section GCNT, an electric power estimating section 111, a demodulating section 112, a decoding section 113, and an error detecting section 114.

The high-frequency signal processing circuit RFC includes a low-noise amplifier (LNA: Low Noise Amplifier) 101, a frequency-converting section (MIX: mixer) 102, and a variable amplifier (VGA: Variable Gain Amplifier) 103. The signal-detecting section DTS includes an electric-power-calculating section 105, a correlation-calculating section 106, and a signal detection-determining section 107. The gain control section GCNT includes a standby gain setting section 108, a gain search range setting section 109, and a gain-determining section 110.

Operations of the sections of the receiving apparatus 100 illustrated in FIG. 1 or FIG. 2 are described below.

The receiving antenna Ant receives a high-frequency signal (e.g., a millimeter wave) transmitted by an external communication partner (e.g., a transmitting device (not illustrated)) of the receiving apparatus 100. The high-frequency signal received by the receiving antenna Ant is supplied to the high-frequency signal processing circuit RFC.

The high-frequency signal processing circuit RFC amplifies the high-frequency signal received by the receiving antenna Ant by using gain (combined gain G) determined by the gain control section GCNT. The high-frequency signal processing circuit RFC converts the high-frequency signal received by the receiving antenna Ant to a baseband signal by using a locally generated signal (a local signal, not illustrated) in the receiving apparatus 100. The baseband signal is supplied to the analog-to-digital converting section 104.

The low-noise amplifier 101 amplifies the high-frequency signal received by the receiving antenna Ant by using the gain of the low-noise amplifier 101 determined by the gain-determining section 110 and then supplies the high-frequency signal to the frequency-converting section 102.

The frequency-converting section 102 down-converts the frequency of the high-frequency signal amplified by the low-noise amplifier 101 by using the locally generated signal (a local signal, not illustrated) in the receiving apparatus 100 so as to convert the high-frequency signal to a baseband signal and then supplies the baseband signal to the variable amplifier 103.

The variable amplifier 103 amplifies the baseband signal supplied by the frequency-converting section 102 by using gain for the variable amplifier 103 determined by the gain-determining section 110 and then supplies the baseband signal to the analog-to-digital converting section 104.

The analog-to-digital converting section 104 AD (analog-to-digital) converts the analog baseband signal amplified by the variable amplifier 103 to a digital baseband signal by quantizing the analog baseband signal and then supplies the digital baseband signal to the electric-power-calculating section 105, the correlation-calculating section 106, and the demodulating section 112.

The receiving apparatus 100 shifts to a standby state for a received signal after the standby gain setting section 108, which will be described later, sets standby gain Gs. Hereinafter, in the standby state for a received signal, a received signal quantized in the analog-to-digital converting section 104 is defined as a "quantized received signal". Details of a process for setting the standby gain Gs in the standby gain setting section 108 will be described later with reference to FIG. 6.

In the standby state for a received signal, the signal-detecting section DTS determines on the basis of output from the analog-to-digital converting section 104 whether or not a signal has been detected, that is, an electric power calculation value of the quantized received signal and a cross-correlation value of the quantized received signal. In a case where it is determined that a signal has been detected, the signal-detecting section DTS outputs a carrier sense signal that indicates that the signal has been detected.

Specifically, the signal detection-determining section 107 uses, as a first criterion for judging signal detection, the electric power calculation value of the quantized received signal calculated by the electric-power-calculating section 105, and uses, as a second criterion for judging signal detection, a cross-correlation value calculated by the correlation-calculating section 106 between the quantized received signal and a known sequence (described later) that is held in advance. The signal detection-determining section 107 determines whether or not a signal has been detected by using the electric power calculation value of the quantized received signal and the cross-correlation value between the quantized received signal and the known sequence (described later). The signal detection-determining section 107 notifies the gain search range setting section 109 of signal detection information about a signal detection method (that is, whether detection of the signal was determined by electric power detection or correlation detection).

Furthermore, in a case where it is determined that a signal has been detected, the signal detection-determining section 107 outputs a carrier sense signal that indicates that the signal has been detected, and in a case where it is determined that the detected signal is a signal transmitted by an apparatus using the same system, which will be described later, the signal detection-determining section 107 supplies a control signal for demodulating the detected signal to the demodulating section 112. Details of a specific determining operation of the signal detection-determining section 107 will be described later with reference to FIG. 7.

Hereinafter, a signal detection method for determining signal detection on the basis of the electric power calculation value of the quantized received signal calculated by the electric-power-calculating section 105 is defined as "electric power detection", and a signal detection method for determining signal detection on the basis of the cross-correlation value calculated by the correlation-calculating section 106 between the quantized received signal and the known sequence (described later) that is held in advance is defined as "correlation detection".

Figure 4A:
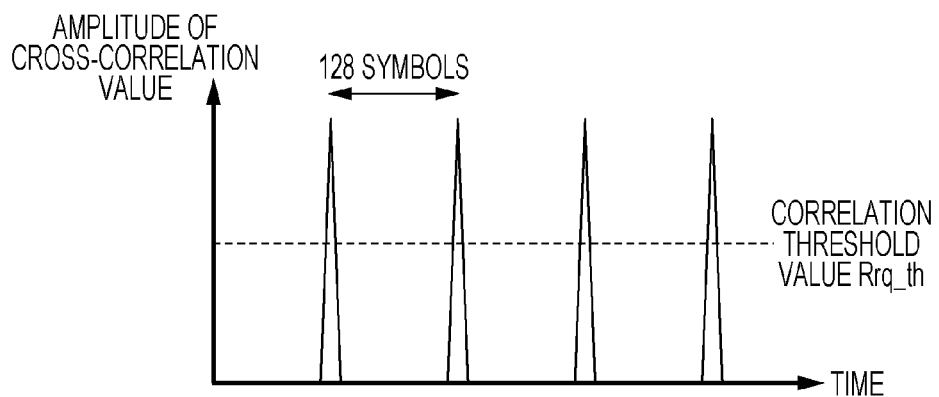
FIGS. 4A and 4B are explanatory views for explaining correlation detection and electric power detection, respectively.
Figure 4B:
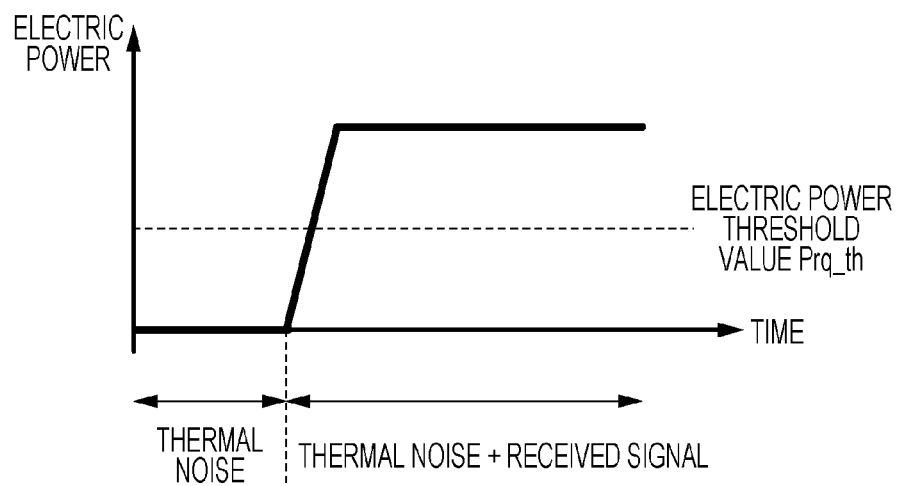

The electric-power-calculating section 105 calculates electric power Prq of the quantized received signal, for example, by squaring the amplitude of the quantized received signal and averaging the number of samples (e.g., 16 samples) within a certain period of time after the standby gain Gs is set, and then supplies the result of the calculation to the signal detection-determining section 107, the standby gain setting section 108, the gain-determining section 110, and the electric power estimating section 111 (see FIG. 4B). FIG. 4B is an explanatory view for explaining electric power detection. In a case where the electric power Prq of the quantized received signal calculated by the electric-power-calculating section 105 exceeds a predetermined electric power threshold value Prq_th, the signal detection-determining section 107 determines that a signal has been detected.

Note that the signal detection-determining section 107 is also capable of detecting an interference signal transmitted by an apparatus using another system (e.g., a transmitting apparatus that supports a communication standard different from that supported by the receiving apparatus 100, the same applies hereinafter) by electric power detection using electric power Prq of a quantized received signal, in addition to a signal transmitted by the apparatus using the same system (e.g., a transmitting apparatus that supports a communication standard (IEEE802.11ad) same as that supported by the receiving apparatus 100, the same applies hereinafter).

In FIG. 4B, a combined electric power value combining an electric power value of a signal and an electric power value of thermal noise rises in a relatively short time relative to a duration of the received signal at a time point at which the receiving apparatus 100 receives the signal. Therefore, the immediacy of signal detection is high, that is, the time needed for signal detection is short. For example, in a case where electric power of the quantized received signal is sufficiently larger than electric power of thermal noise, and a receiving SNR (Signal-to-Noise Ratio) indicative of the reception intensity in a communication path for communication with a communication partner is high, a combined electric power value combining an electric power value of the signal and an electric power value of the thermal noise rises rapidly. However, as the receiving SNR decreases, the electric power of the quantized received signal decreases relative to the electric power of the thermal noise. This delays rising of the combined electric power value combining the electric power value of the signal and the electric power value of the thermal noise. Consequently, the time point at which a signal is detected is delayed.

Figure 3:
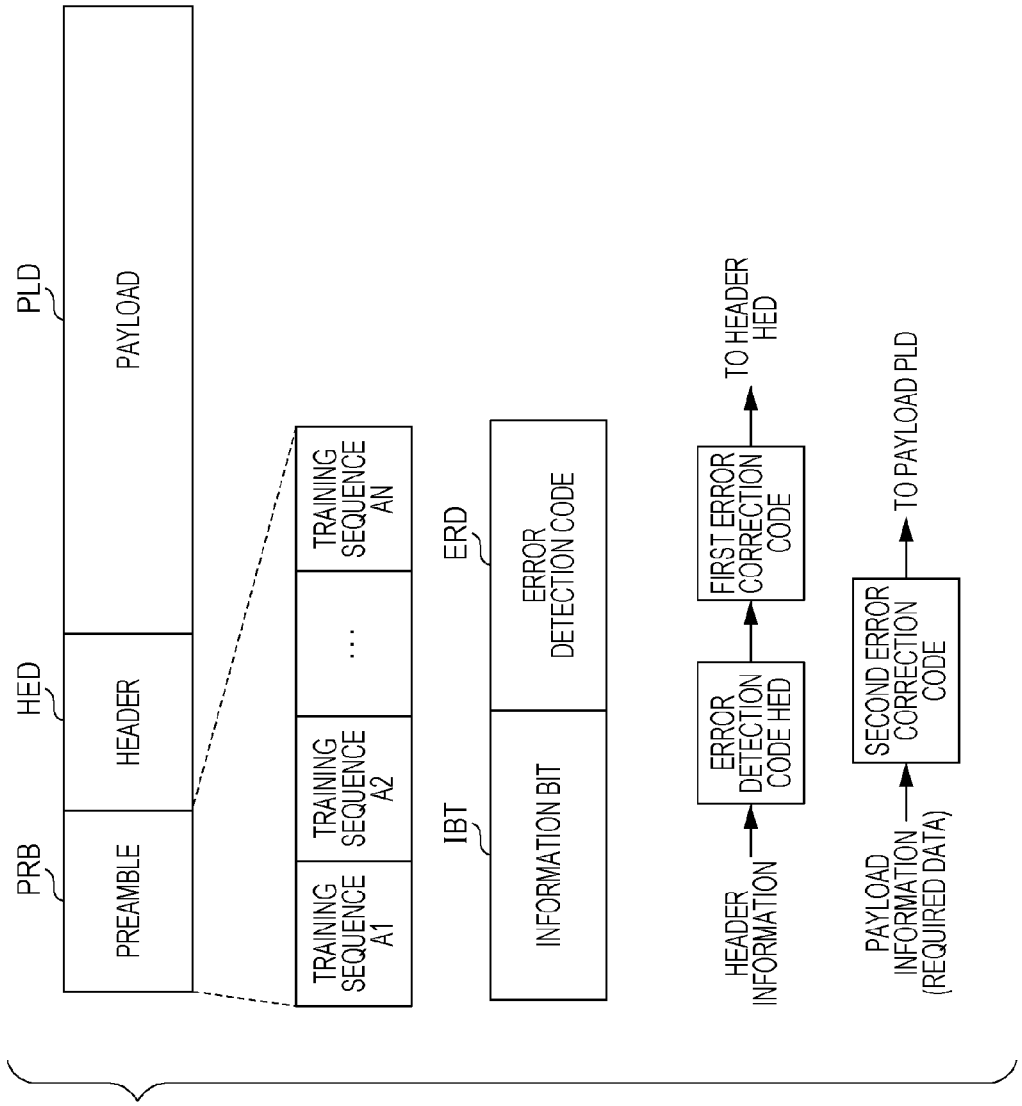
FIG. 3 is an explanatory view for explaining a structure of a packet received by the receiving apparatus of the present embodiment and an error detection code added to the packet.

The correlation-calculating section 106 calculates a cross-correlation value between the quantized received signal and a known sequence (training sequence) that is held in advance, and then supplies the cross-correlation value to the signal detection-determining section 107. The training sequence is, for example in the case of IEEE802.11ad, a golay sequence that constitutes a preamble PRB added to the start of the packet, as illustrated in FIG. 3, but is not limited to a golay sequence. FIG. 3 is an explanatory view for explaining a structure of a packet received by the receiving apparatus 100 of the present embodiment and an error detection code added to the packet.

A transmitting apparatus (not illustrated) which is a communication partner of the receiving apparatus 100 transmits a packet having the preamble PRB added to the start thereof. The preamble PRB is constituted by a plurality of training sequences A1, A2, . . . AN that are coupled with each other.

The correlation-calculating section 106 holds a plurality of training sequences A1 to AN and calculates a cross-correlation value Rrq between the plurality of training sequences A1 to AN in the preamble PRB of the quantized received signal and the plurality of training sequences A1 to AN that are held in advance (see FIG. 4A). FIG. 4A is an explanatory view for explaining correlation detection. In a case where a peak of the cross-correlation value Rrq calculated by the correlation-calculating section 106 between the quantized received signal and the training sequences A1 to AN exceeds a correlation threshold value Rrq_th, as illustrated in FIG. 4A, the signal detection-determining section 107 determines that a signal has been detected.

Note that in a case where the receiving apparatus 100 receives a signal transmitted by an apparatus using the same system, that is, a signal transmitted by a transmitting apparatus which is a communication partner included in the present system, the peak of the cross-correlation value Rrq calculated by the correlation-calculating section 106 exceeds the correlation threshold value Rrq_th, but in a case where the receiving apparatus 100 receives an interference signal transmitted by an apparatus using another system, there is no peak of the cross-correlation value Rrq that exceeds the correlation threshold value Rrq_th. In this way, the signal detection-determining section 107 can determine, by correlation detection in the correlation-calculating section 106, whether the quantized received signal is a signal transmitted by an apparatus using the same system or an interference signal transmitted by an apparatus using another system, that is, a signal that has a packet format different from that of the present system.

Furthermore, the correlation-calculating section 106 can improve an SNR of the peak of the cross-correlation value Rrq by using, as a training sequence, a known sequence that has a good ability to suppress a side lobe of a cross-correlation value. For example, a golay sequence used in IEEE802.11ad has a good ability to suppress a side lobe of the cross-correlation value Rrq.

In a case where a sequence that can ideally suppress a side lobe is used, the SNR of the peak of the cross-correlation value Rrq is logically a value obtained by multiplying the SNR of the quantized received signal by the sequence length. For example, in a case where the sequence length is 128 symbols, the SNR is 128 times larger than the SNR of the quantized received signal. Even in a case where the SNR of the quantized received signal is small, the accuracy of signal detection using the cross-correlation value Rrq is high since the SNR of the peak of the cross-correlation value Rrq is large.

Meanwhile, the peak of the cross-correlation value Rrq in the correlation-calculating section 106 does not appear until all of the symbols that constitute the training sequence are received by the receiving apparatus 100. For example, in FIG. 4A, in a case where the number of symbols that constitute each of the training sequences A1 to AN is 128 symbols, the peak of the cross-correlation value Rrq appears 128 symbols later than the start of reception of the quantized received signal. That is, a waiting time is needed for judging signal detection by correlation detection.

The gain control section GCNT monitors the electric power of the thermal noise quantized in the analog-to-digital converting section 104 in the standby state for a received signal. Hereinafter, thermal noise quantized in the analog-to-digital converting section 104 in the standby state for a received signal is defined as a "quantized noise signal".

The gain control section GCNT adjusts a gain search range in an AGC process in accordance with the electric power Prq of the signal detected by the signal detection-determining section 107, that is, the quantized received signal, by using an estimated value Pr of electric power of a signal before quantization estimated by the electric power estimating section 111, which will be described later, and the result of error detection by the error detecting section 114, which will be described later.

The gain control section GCNT controls gain of the low-noise amplifier 101 and gain of the variable amplifier 103 so that a band of fluctuation of the level of the quantized received signal falls within the dynamic range of the analog-to-digital converting section 104 after detection of a signal is determined by the signal detection-determining section 107.

The standby gain setting section 108 monitors the electric power Pn of the quantized noise signal supplied by the analog-to-digital converting section 104 in the standby state for a received signal. The standby gain setting section 108 determines the gain of the low-noise amplifier 101 and the gain of the variable amplifier 103 so that the electric power Pn of the quantized noise signal becomes a predetermined standby electric power target value Pn_target.

The standby electric power target value Pn_target is, for example, a predetermined proportion (e.g., 30 percent) of the electric power at which the output amplitude of the analog-to-digital converting section 104 becomes maximum. Hereinafter, the sum of the gain of the low-noise amplifier 101 and the gain of the variable amplifier 103 in the standby state is referred to as "standby gain Gs".

The standby gain setting section 108 adjusts the standby gain Gs to a large value so that the quantized noise electric power Pn becomes the standby electric power target value Pn_target. This adjustment of the standby gain Gs to a large value is performed so that even in a case where the electric power of the received signal before quantization is small, the electric power of the received signal before quantization is adjusted to a value equal to or larger than the quantization resolution of the analog-to-digital converting section 104 through amplification by the low-noise amplifier 101 and the variable amplifier 103, and the electric power Prq of the quantized received signal is detected. Details of a specific AGC operation of the standby gain setting section 108 will be described later with reference to FIG. 8.

The gain search range setting section 109 adjusts and sets a gain search range in the AGC process in accordance with the electric power Prq of the signal detected by the signal detection-determining section 107, that is, the quantized received signal, by using the estimated value Pr of the electric power of the signal before quantization estimated by the electric power estimating section 111 and the result of error detection by the error detecting section 114, which will be described later. The gain search range in the AGC process is a gain search range for the gain of the low-noise amplifier 101 and the gain of the variable amplifier 103. A specific operation of the gain search range setting section 109 of the gain control section GCNT will be described later with reference to FIGS. 9 to 14.

The gain-determining section 110 executes the AGC process by using the standby gain Gs (described later) set by the standby gain setting section 108 and the electric power Prq of the quantized received signal calculated by the electric-power-calculating section 105 in the gain search range set by the gain search range setting section 109, which will be described later.

In other words, the gain-determining section 110 determines the gain of the low-noise amplifier 101 and the gain of the variable amplifier 103 in the gain search range set by the gain search range setting section 109 so that the electric power Prq of the signal detected by the signal detection-determining section 107, that is, the quantized received signal, becomes a predetermined reception electric power target value Prq_target. Hereinafter, the sum of the gain of the low-noise amplifier 101 and the gain of the variable amplifier 103 is referred to as "combined gain G".

After determining the gain of the low-noise amplifier 101 and the gain of the variable amplifier 103, the gain-determining section 110 sets, in the low-noise amplifier 101, the gain of the low-noise amplifier 101 and sets, in the variable amplifier 103, the gain of the variable amplifier 103. The reception electric power target value Prq_target is, for example, a predetermined proportion (e.g., 60 percent) of the electric power at which the output amplitude of the analog-to-digital converting section 104 becomes maximum. Note that the reception electric power target value Prq_target is higher than the standby electric power target value Pn_target, which will be described later.

The gain-determining section 110 increases the combined gain G in a case where the electric power Prq of the quantized received signal is smaller than the reception electric power target value Prq_target, and reduces the combined gain G in a case where the electric power Prq of the quantized received signal is larger than the reception electric power target value Prq_target. In a case where the electric power Prq of the quantized received signal does not reach the reception electric power target value Prq_target within a specified period of time in the AGC process, the gain-determining section 110 determines that the AGC process has timed out and forcibly ends the AGC process. Details of a specific operation of the AGC process of the gain-determining section 110 will be described later with reference to FIG. 8.

The electric power estimating section 111 estimates the electric power of the signal that has not been quantized in the analog-to-digital converting section 104 by using the combined gain G determined by the gain-determining section 110 and the electric power Prq of the quantized received signal calculated by the electric-power-calculating section 105 after completion of the AGC process in the gain control section GCNT, that is, determination of the combined gain G in the gain-determining section 110 and setting of the gain of the low-noise amplifier 101 and the gain of the variable amplifier 103. The electric power estimating section 111 supplies the estimated value Pr of the electric power to the gain search range setting section 109 of the gain control section GCNT.

The estimated value Pr of the electric power of the received signal estimated by the electric power estimating section 111 is, for example, expressed by expression (1) by using the electric power Prq of the quantized received signal obtained after completion (convergence) of AGC and the combined gain G obtained after convergence of AGC.

$$Pr = \frac{Prq}{G} \quad (1)$$

The demodulating section 112 demodulates the quantized received signal quantized by the analog-to-digital converting section 104 in accordance with a control signal supplied by the signal detection-determining section 107 and then supplies the result of the demodulation to the decoding section 113. The demodulating section 112 demodulates the quantized received signal in the order of a region of a header HED and a region of a payload PLD after convergence of AGC in the signal-detecting section DTS and the gain control section GCNT.

The decoding section 113 executes a predetermined error correction decoding process on the result of the demodulation in the demodulating section 112 to restore an information bit IBT transmitted by the transmitting apparatus and then supplies the information bit IBT to a subsequent stage.

The error detecting section 114 executes a predetermined error correction decoding process on header information of the information bit IBT restored by the decoding section 113. The error detecting section 114 notifies the gain search range setting section 109 of the result of error detection executed on the header information.

In the present embodiment, the transmitting apparatus (not illustrated) transmits an information bit IBT to which a predetermined error detection code ERD is added to the receiving apparatus 100 so that the error detecting section 114 detects a reception error of the header information and the payload information. As the error detection code ERD, for example, a CRC (Cyclic Redundancy Check) code is used.

In the present embodiment, the error detection code ERD is added corresponding to the header HED in the packet illustrated in FIG. 3. The header HED illustrated in FIG. 3 is a field in which control information needed for demodulation of the payload PLD is stored. The payload PLD is information data, such as image data, other than control information stored in the preamble PRB and the header HED.

In the present embodiment, the transmitting apparatus (not illustrated) adds a predetermined error correction code ERD to the header HED in order to increase the resistance to a reception error caused by external noise, and furthermore demodulates the header information stored in the header HED. For example, the transmitting apparatus executes error correction coding of a low code rate as coding using the error correction code ERD and uses a demodulation method of a smaller modulation level as a method of demodulation of the header information.

For example, in IEEE802.11ad, a header format for increasing the error resistance of the header HED is used. Since the resistance of the header HED to an error caused by external noise is high, the probability of occurrence of a reception error caused by external noise is low. That is, in a case where a reception error of the region of the header HED occurs, it is highly likely that the reception error is one that is caused by delay of the start of demodulation in the demodulating section 112.

In the present embodiment, the transmitting apparatus adds, to the header information to which the error detection code ERD has been added, a first error correction code that has higher correction capability than the error correction coding executed on the payload information. The transmitting apparatus adds, to the payload information, a second error correction code that has lower correction capability than the error correction code added to the header information.

Outline of Overall Operation of Reception Process in Receiving Apparatus 100

Next, an overall operation procedure of the reception process of the receiving apparatus 100 of the present embodiment is described with reference to FIG. 5. FIG. 5 is a flow chart for explaining an example of an overall operation procedure of the reception process of the receiving apparatus 100 of the present embodiment.

In FIG. 5, the receiving apparatus 100 first sets standby gain Gs in the standby gain setting section 108 (S1). Details of the process for setting the standby gain Gs in the standby gain setting section 108 will be described with reference to FIG. 6. The receiving apparatus 100 waits for a signal transmitted by the transmitting apparatus (not illustrated) after setting the standby gain Gs (S2).

In a case where the signal detection-determining section 107 does not detect a signal from the transmitting apparatus (NO in S3), the receiving apparatus 100 enters a standby period until a signal is detected (S2).

Meanwhile, in a case where the signal detection-determining section 107 detects, i.e., receives a signal transmitted by the transmitting apparatus for the first time (YES in S3 and S4), the receiving apparatus 100 sets a gain search range in the AGC process in accordance with the initially-received signal (the first reception of a desired signal) in the gain search range setting section 109 (S5). Details of the process for setting the gain search range in the AGC process in accordance with the initially-received signal in the gain search range setting section 109 will be described with reference to FIG. 9. Note that the signal transmitted by the transmitting apparatus is a signal that includes the packet and the error detection code illustrated in FIG. 3.

After the gain search range in the AGC process is set in accordance with the initially-received signal or in a case where the signal detection-determining section 107 detects a signal transmitted by the identical transmitting apparatus for the second or subsequent time (YES in S3 and NO in S4), the receiving apparatus 100 executes, in the gain-determining section 110, the AGC process on a quantized received signal quantized by the analog-to-digital converting section 104 (S6). Details of the AGC process in the gain-determining section 110 will be described later with reference to FIG. 8.

After the AGC process is executed on the quantized received signal quantized by the analog-to-digital converting section 104, the receiving apparatus 100 demodulates the quantized received signal in the demodulating section 112 (S7), and decodes the result of the demodulation of the quantized received signal in the decoding section 113 (S8).

After decoding the result of the demodulation of the quantized received signal, the receiving apparatus 100 adjusts and determines the gain search range in the AGC process for a signal (packet) received next in the gain search range setting section 109 (S9).

In a case where the receiving apparatus 100 continues waiting for a signal transmitted by the identical transmitting apparatus (YES in S10) after adjusting the gain search range in Step S9, the processes in Steps S2 to S9 are repeated until the receiving apparatus 100 stops continuing waiting for a signal transmitted by the identical transmitting apparatus. In a case where the receiving apparatus 100 does not continue waiting for a signal transmitted by the identical transmitting apparatus (NO in S10), the operation of the receiving apparatus 100 illustrated in FIG. 5 is finished.

Details of Process for Setting Standby Gain Gs in Receiving Apparatus 100

Figure 6:
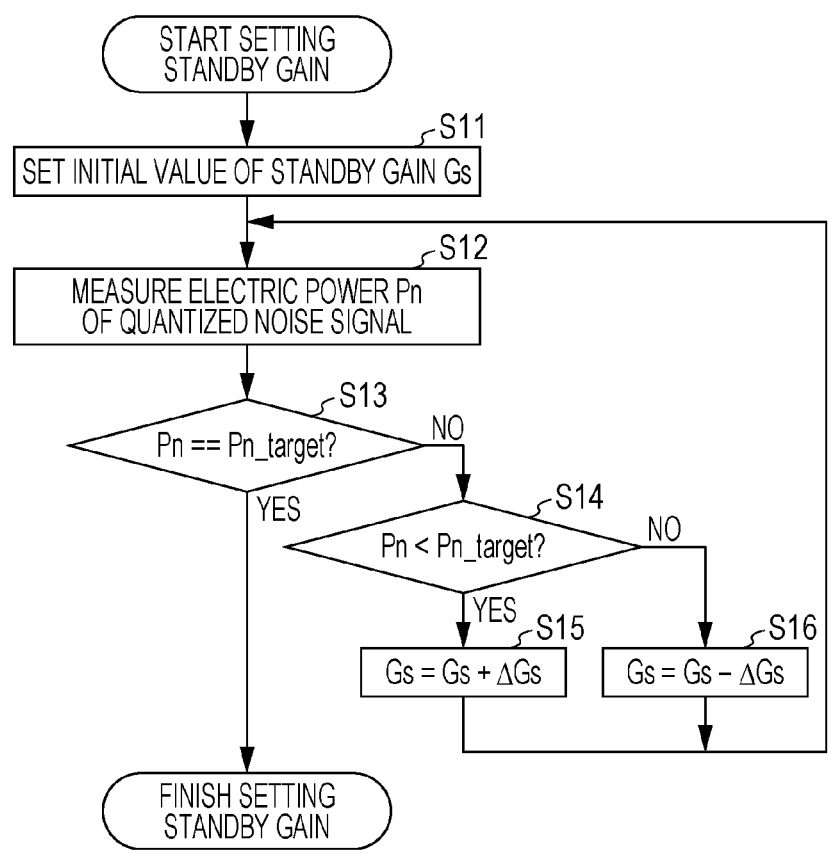
FIG. 6 is a flow chart for explaining an example of an operation procedure of a process for setting standby gain in the receiving apparatus of the present embodiment.

Next, the details of the process for setting the standby gain Gs in the receiving apparatus 100 of the present embodiment are described with reference to FIG. 6. FIG. 6 is a flow chart for explaining an example of the operation procedure of the process for setting the standby gain Gs in the receiving apparatus 100 of the present embodiment.

In FIG. 6, the standby gain setting section 108 sets an initial value of the standby gain Gs (S11). After setting the initial value of the standby gain Gs, the standby gain setting section 108 monitors electric power Pn of the quantized noise signal quantized by the analog-to-digital converting section 104 in a standby state for a signal. Specifically, the standby gain setting section 108 measures the electric power Pn of the quantized noise signal calculated by the electric-power-calculating section 105 (S12).

The standby gain setting section 108 determines gain of the low-noise amplifier 101 and gain of the variable amplifier 103 so that the electric power Pn of the quantized noise signal measured in Step S12 becomes a predetermined standby electric power target value Pn_target.

For example, in a case where the standby gain setting section 108 determines that the electric power Pn of the quantized noise signal measured in Step S12 is equal to the predetermined standby electric power target value Pn_target (YES in S13), the standby gain setting section 108 determines that the value of the standby gain Gs is appropriate and finishes the process for setting the standby gain illustrated in FIG. 6. "A==B?" represents a branch on condition for determining whether or not the value of A is equal to the value of B. The same applies hereafter.

In a case where the standby gain setting section 108 determines that the electric power Pn of the quantized noise signal measured in Step S12 is not equal to the predetermined standby electric power target value Pn_target (NO in S13), the standby gain setting section 108 determines whether or not the electric power Pn of the quantized noise signal measured in Step S12 is smaller than the predetermined standby electric power target value Pn_target (S14).

In a case where the standby gain setting section 108 determines that the electric power Pn of the quantized noise signal measured in Step S12 is smaller than the predetermined standby electric power target value Pn_target (YES in S14), the standby gain setting section 108 adds a predetermined standby gain increased value ΔGs to the value of the standby gain Gs (S15), and then measures the electric power Pn of the quantized noise signal calculated by the electric-power-calculating section 105 again (S12).

Meanwhile, in a case where the standby gain setting section 108 determines that the electric power Pn of the quantized noise signal measured in Step S12 is larger than the predetermined standby electric power target value Pn_target (NO in S14), the standby gain setting section 108 subtracts the predetermined standby gain increased value ΔGs from the value of the standby gain Gs (S16), and then measures the electric power Pn of the quantized noise signal calculated by the electric-power-calculating section 105 again (S12).

In this way, the standby gain setting section 108 repeats the processes in Steps S14 to 16 until it is determined that the electric power Pn of the quantized noise signal measured in Step S12 is equal to the predetermined standby electric power target value Pn_target.

Details of Process for Detecting Signal in Receiving Apparatus 100

Figure 7:
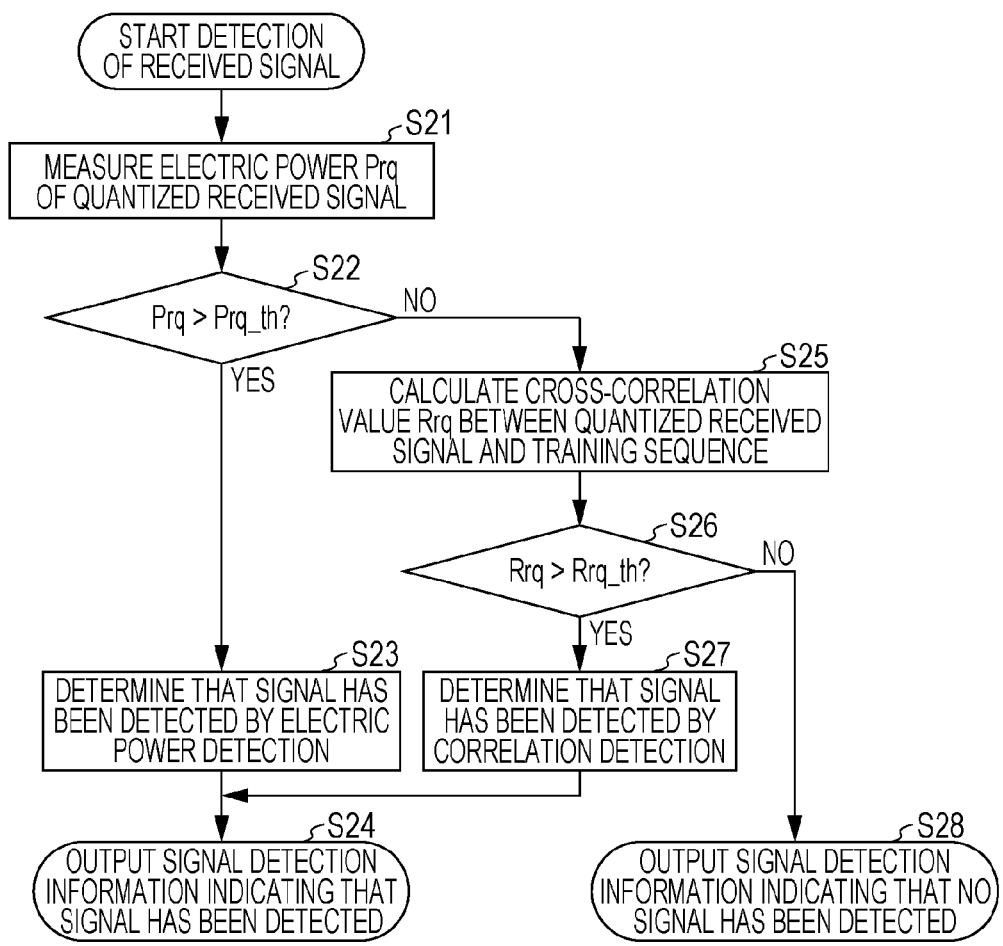
FIG. 7 is a flow chart for explaining an example of an operation procedure of a process for detecting a signal in the receiving apparatus of the present embodiment.

Next, details of the process for detecting a signal in the receiving apparatus 100 of the present embodiment are described with reference to FIG. 7. FIG. 7 is a flow chart for explaining an example of an operation procedure of the process for detecting a signal in the receiving apparatus 100 of the present embodiment. As a premise of explanation of the flow chart illustrated in FIG. 7, the standby gain Gs illustrated in FIG. 6 has been set by the standby gain setting section 108.

In FIG. 7, after the standby gain Gs is set, the signal detection-determining section 107 measures the electric power Prq of the quantized received signal quantized by the analog-to-digital converting section 104, that is, the electric power Prq of the quantized received signal calculated by the electric-power-calculating section 105 in a standby state for a signal (S21).

The signal detection-determining section 107 determines whether or not the electric power Prq of the quantized received signal measured in Step S21 exceeds the predetermined electric power threshold value Prq_th (S22).

In a case where the signal detection-determining section 107 determines that the electric power Prq of the quantized received signal measured in Step S21 exceeds the predetermined electric power threshold value Prq_th (YES in S22), the signal detection-determining section 107 determines that a signal has been detected by electric power detection (S23). The signal detection-determining section 107 supplies, to the gain search range setting section 109, signal detection information indicating that a signal has been detected by electric power detection (S24). Then, the operation of the signal detection-determining section 107 illustrated in FIG. 7 is finished.

Meanwhile, in a case where the signal detection-determining section 107 determines that the electric power Prq of the quantized received signal measured in Step S21 does not exceed the predetermined electric power threshold value Prq_th (NO in S22), the signal detection-determining section 107 acquires a cross-correlation value Rrq calculated by the correlation-calculating section 106 in Step S25. Note that the correlation-calculating section 106 calculates the cross-correlation value Rrq between training sequences A1 to AN added to the preamble PRB of the quantized received signal and training sequences A1 to AN held in advance by the correlation-calculating section 106 (S25).

The signal detection-determining section 107 determines whether or not the cross-correlation value Rrq calculated by the correlation-calculating section 106 in Step S25 is larger than the predetermined correlation threshold value Rrq_th (S26).

In a case where the signal detection-determining section 107 determines that the cross-correlation value Rrq calculated by the correlation-calculating section 106 in Step S25 is larger than the predetermined correlation threshold value Rrq_th (YES in S26), the signal detection-determining section 107 determines that a signal has been detected by correlation detection (S27). The signal detection-determining section 107 supplies, to the gain search range setting section 109, signal detection information indicating that a signal has been detected by correlation detection (S24). Then, the operation of the signal detection-determining section 107 illustrated in FIG. 7 is finished.

Meanwhile, in a case where the signal detection-determining section 107 determines that the cross-correlation value Rrq calculated by the correlation-calculating section 106 in Step S25 is smaller than the predetermined correlation threshold value Rrq_th (NO in S26), the signal detection-determining section 107 supplies, to the gain search range setting section 109, signal detection information indicating that no signal has been detected (S24). Then, the operation of the signal detection-determining section 107 illustrated in FIG. 7 is finished.

Details of AGC Process in Receiving Apparatus 100

Figure 8:
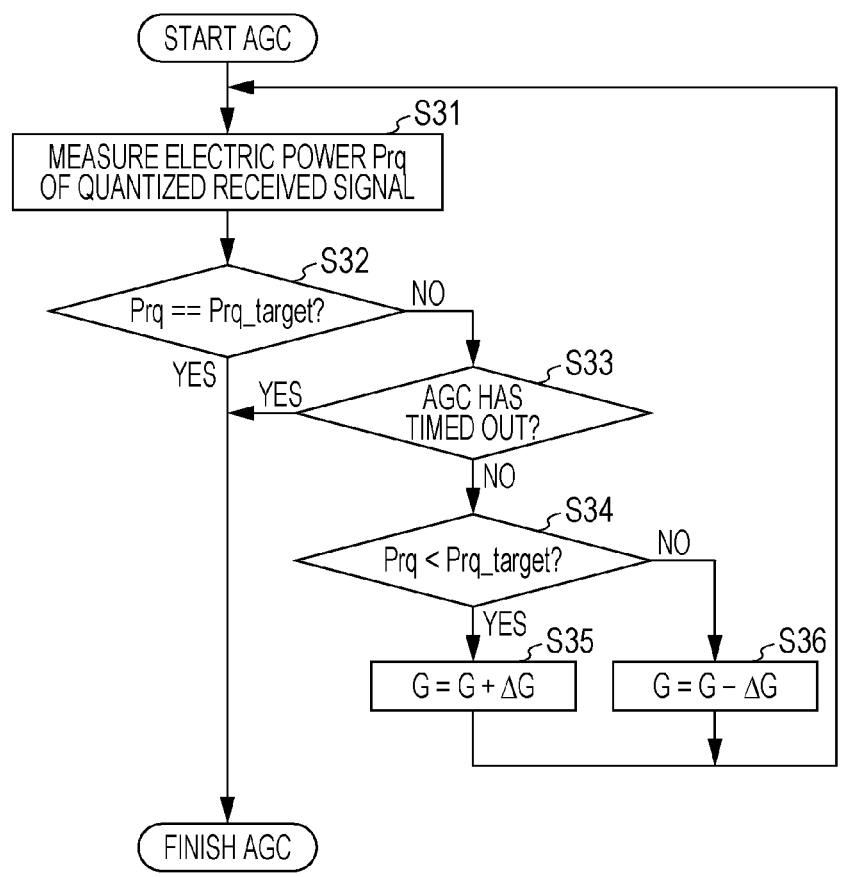
FIG. 8 is a flow chart for explaining an example of an operation procedure of an AGC process in the receiving apparatus of the present embodiment.

Next, details of the AGC process in the receiving apparatus 100 of the present embodiment are described with reference to FIG. 8. FIG. 8 is a flow chart for explaining an example of an operation procedure of the AGC process in the receiving apparatus 100 of the present embodiment. As a premise of explanation of the flow chart illustrated in FIG. 8, signal detection information indicating that a signal has been detected has been supplied to the gain-determining section 110 in accordance with the flow chart illustrated in FIG. 7 in the flow chart illustrated in FIG. 7.

In FIG. 8, after acquiring, from the signal detection-determining section 107, the signal detection information indicating that a signal has been detected, the gain-determining section 110 acquires the electric power value Prq of the quantized received signal calculated by the electric-power-calculating section 105 (S31).

The gain-determining section 110 determines whether or not the electric power Prq of the quantized received signal measured in Step S31 is equal to the predetermined reception electric power target value Prq_target (S32). In a case where the gain-determining section 110 determines that the electric power Prq of the quantized received signal measured in Step S31 is equal to the predetermined reception electric power target value Prq_target (YES in S32), the AGC process illustrated in FIG. 8 is finished.

Meanwhile, in a case where the gain-determining section 110 determines that the electric power Prq of the quantized received signal measured in Step S31 is not equal to the predetermined reception electric power target value Prq_target (NO in S32) and in a case where it is difficult to match the electric power Prq of the quantized received signal measured in Step S31 with the predetermined reception electric power target value Prq_target within a predetermined specified period of time (e.g., a period of time corresponding to the code length of the preamble PRB) (YES in S33), the gain-determining section 110 determines that the AGC process has timed out and forcibly ends the AGC process.

In a case where the predetermined specified period of time has not elapsed (NO in S33), the gain-determining section 110 determines whether or not the electric power Prq of the quantized received signal measured in Step S31 is smaller than the predetermined reception electric power target value Prq_target (S34).

In a case where the gain-determining section 110 determines that the electric power Prq of the quantized received signal measured in Step S31 is smaller than the predetermined reception electric power target value Prq_target (YES in S34), the gain-determining section 110 newly sets, as the combined gain G, gain obtained by adding a predetermined gain increased value ΔG to the value of the combined gain G (S35). The gain-determining section 110 controls gain of the LNA 101 and gain of the VGA 103 so that the gain of the LNA 101 and the gain of the VGA 103 become the newly set combined gain G. A next symbol in the identical preamble PRB, for example, a symbol included in the training sequences A1 to AN is signal-amplified by using the new combined gain G set as described above and quantized by the analog-to-digital converting section 104. The quantized received signal is supplied to the electric-power-calculating section 105, and the electric-power-calculating section 105 calculates the electric power Prq of the quantized received signal (S31).

Meanwhile, in a case where the gain-determining section 110 determines that the electric power Prq of the quantized received signal measured in Step S32 is larger than the predetermined reception electric power target value Prq_target (NO in S34), the gain-determining section 110 newly sets, as the combined gain G, gain obtained by subtracting the predetermined gain increased value ΔG from the value of the combined gain G (S36). The gain-determining section 110 controls the gain of the LNA 101 and the gain of the VGA 103 so that the gain of the LNA 101 and the gain of the VGA 103 become the newly set combined gain G. A next symbol in the identical preamble PRB, for example, a symbol included in the training sequences A1 to AN is signal-amplified by using the new combined gain G set as described above and quantized by the analog-to-digital converting section 104. The quantized received signal is supplied to the electric-power-calculating section 105, and the electric-power-calculating section 105 calculates the electric power Prq of the quantized received signal (S31).

In this way, the gain-determining section 110 repeats the processes in Steps S33 to S36 until it is determined that the electric power Prq of the quantized received signal measured in Step S31 is equal to the predetermined reception electric power target value Prq_target.

Details of Process for Setting Gain Search Range in Accordance with Initially-Received Signal after Activation of Receiving Apparatus 100

Figure 9:
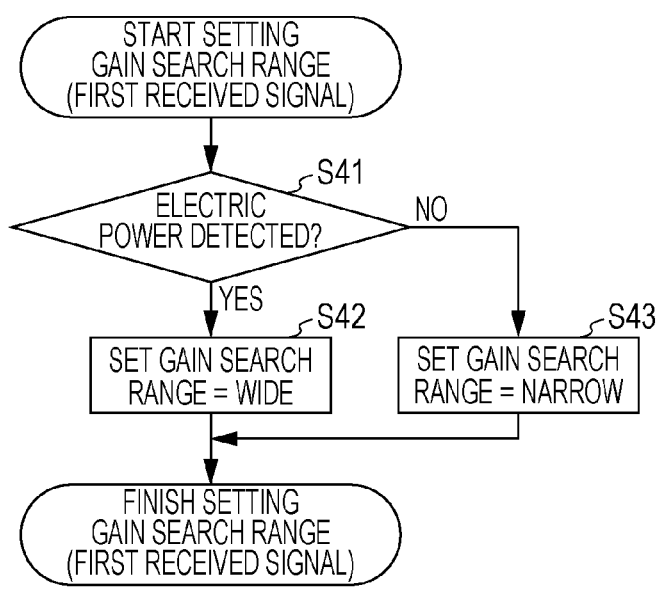
FIG. 9 is a flow chart for explaining an example of an operation procedure of a process for setting a gain search range in accordance with an initially-received signal in the receiving apparatus of the present embodiment.

Next, details of the process for setting the gain search range in accordance with the initially-received signal after activation of the receiving apparatus 100 of the present embodiment are described with reference to FIG. 9. FIG. 9 is a flow chart for explaining an example of an operation procedure of the process for setting the gain search range in accordance with the initially-received signal after activation of the receiving apparatus 100 of the present embodiment. As a premise of explanation of the flow chart illustrated in FIG. 9, signal detection information indicating that a signal has been detected by electric power detection or correlation detection has been supplied to the gain search range setting section 109 in accordance with the flow chart illustrated in FIG. 7.

In FIG. 9, the gain search range setting section 109 determines whether the signal was detected by electric power detection or correlation detection on the basis of the signal detection information supplied by the signal detection-determining section 107 (S41).

In a case where the gain search range setting section 109 determines that a signal has been detected by electric power detection (YES in S41), the gain search range setting section 109 widens the gain search range of the combined gain G in the AGC process (S42). For example, the gain search range setting section 109 widens the gain search range by adjusting a control range of the combined gain G in the gain-determining section 110 to a maximum range. The maximum control range of the combined gain G is, for example, a range of [Gmin, Gmax] where Gmin and Gmax are a minimum value and a maximum value of the combined gain G which is the sum of the gain of the low-noise amplifier 101 and the gain of the variable amplifier 103, respectively.

That is, in a case where the electric power Prq of the quantized received signal exceeds the electric power threshold value Prq_th, a receiving SNR of the quantized received signal is large, and rising of the electric power is fast (see FIG. 4B). Accordingly, a time point at which the signal is detected by electric power detection is earlier than a time point at which the signal is detected by correlation detection.

Accordingly, in a case where a time point at which the signal is detected by electric power detection is earlier than a time point at which the signal is detected by correlation detection, the gain search range setting section 109 can estimate that a reception intensity of a communication path between the receiving apparatus 100 and the transmitting apparatus (not illustrated) which is a communication partner is a strong electric field. That is, since the combined gain G need be largely reduced from a current setting value, the gain search range setting section 109 widens the gain search range of the combined gain G in AGC.

Note that the communication path between the receiving apparatus 100 and the transmitting apparatus (not illustrated) which is a communication partner is estimated by the reception intensity of the signal transmitted by the transmitting apparatus and received by the receiving apparatus 100.

Meanwhile, in a case where the gain search range setting section 109 determines that a signal has been detected by correlation detection (NO in S41), the gain search range setting section 109 narrows the gain search range of the combined gain G in the AGC process and increases the value of the combined gain G (S43). For example, a range in which the value of the combined gain G is increased is a range of [Rn×Gmax, Gmax] where Rn (e.g., approximately 0.3) is a restriction rate of the control range of the combined gain G.

That is, in a case where the electric power Prq of the quantized received signal does not exceed the electric power threshold value Prq_th, the receiving SNR of the quantized received signal is small. In this case, it is difficult to detect a signal by electric power detection, and it is therefore considered that a signal is detected by correlation detection.

Accordingly, in a case where a time point at which the signal is detected by correlation detection is earlier than a time point at which the signal is detected by electric power detection, the gain search range setting section 109 estimates that the reception intensity of the communication path between the receiving apparatus 100 and the transmitting apparatus (not illustrated) which is a communication partner is a weak electric field. That is, since the combined gain G need not be largely reduced from a current setting value, the gain search range setting section 109 narrows the gain search range of the combined gain G in AGC.

This shortens a period of time required for convergence of the AGC process in the gain-determining section 110. Furthermore, even in a case where a long time is needed before detection of a signal by correlation detection within a restricted period of time corresponding to a predetermined preamble PRB, the gain-determining section 110 can rapidly converge the AGC process. That is, the start of demodulation in the demodulating section 112 is not delayed.

As described above, in the receiving apparatus 100, the signal detection-determining section 107 determines whether a signal is detected by electric power detection or correlation detection, in the first reception of a packet after activation (rising), that is, the first reception of a signal transmitted by the transmitting apparatus, and the gain search range of the combined gain G in the AGC process is set in accordance with a signal detection method by which the signal has been detected (see Table 1). Table 1 is a table in which signal detection methods and gain search ranges are associated.

TABLE 1

| Signal detection method | Gain search range |
|---|---|
| Electric power detection | widen |
| Correlation detection | narrow |

When the gain search range of the combined gain G in the AGC process is set on the basis of a signal detection method, there is a possibility that the gain search range becomes inappropriate in a case where the reception intensity in the communication path between the receiving apparatus 100 and the transmitting apparatus is a medium electric field. For example, in a case where the reception intensity is a medium electric field, it takes a longer period of time to detect a signal by electric power detection than a case where the reception intensity is a strong electric field, and this period of time is similar to a period of time needed for detection of a signal by correlation detection. Note that which of electric power detection and correlation detection is executed earlier depends on thermal noise that occurs.

In this case, in a case where a signal is detected by electric power detection and the gain search range setting section 109 widens the gain search range of the combined gain G, a period of time needed for convergence of the AGC process becomes longer. Accordingly, both the period of time needed for detection of a signal by electric power detection and the period of time needed for convergence of the AGC process become longer. This delays the start of demodulation in the demodulating section 112. Therefore, there is a possibility that an error occurs in the information bit IBT restored by the decoding section 113.

Figure 10:
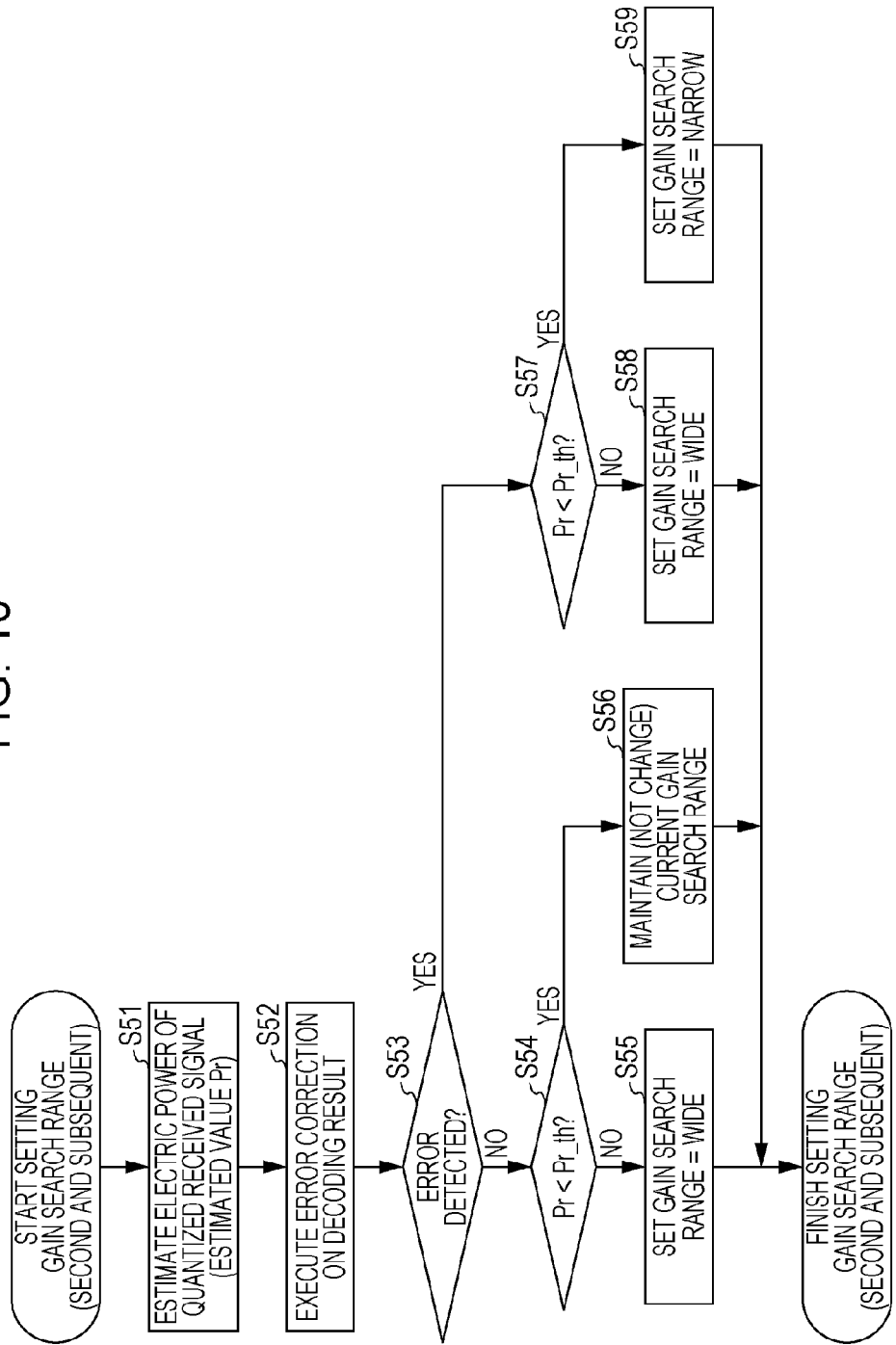
FIG. 10 is a flow chart for explaining an example of an operation procedure of a process for setting a gain search range in accordance with a received signal in the second or subsequent communication in the receiving apparatus of the present embodiment.

In view of this, in order to avoid delay of the start of demodulation in the case of a medium electric field, the gain search range setting section 109 determines and sets the gain search range of the combined gain G in the AGC process by using the estimated value Pr of the electric power estimated by the electric power estimating section 111 and the result of error detection of a header region outputted by the error detecting section 114, in preparation for a packet received next (see FIG. 10).

Setting of Gain Search Range for Signal Received for Second or Subsequent Time in Receiving Apparatus 100

Next, details of the process for setting the gain search range of the combined gain G in the AGC process for a signal received for the second or subsequent time that is transmitted by the identical transmitting apparatus and received by the receiving apparatus 100 of the present embodiment are described with reference to FIG. 10. FIG. 10 is a flow chart for explaining an example of an operation procedure of the process for setting the gain search range for a signal received for the second or subsequent time in the receiving apparatus 100 of the present embodiment.

In FIG. 10, after acquiring, from the signal detection-determining section 107, signal detection information indicating that a received signal has been detected, the gain search range setting section 109 measures the estimated value Pr of the electric power of the quantized received signal outputted from the electric power estimating section 111 (S51). Furthermore, the error detecting section 114 executes a predetermined error detection process on header information of the information bit IBT restored by the decoding section 113 (S52). The error detecting section 114 notifies the gain search range setting section 109 of the result of the error detection executed on the header information.

The gain search range setting section 109 determines whether or not a reception error for the header information has been detected, by using the result of the error detection in the error detecting section 114 (S53).

In a case where a reception error for the header information is not detected (NO in S53), the gain search range setting section 109 determines whether or not determines whether or not the estimated value Pr of the electric power of the quantized received signal measured in Step S51 is smaller than a predetermined strong electric field threshold value Pr_th (S54).

Note that the strong electric field threshold value Pr_th is a threshold value indicating whether or not the communication path between the receiving apparatus and the transmitting apparatus is a strong electric field. In a case where the estimated value Pr of the electric power of the quantized received signal measured in Step S51 is larger than the strong electric field threshold value Pr_th, the reception intensity of the communication path between the receiving apparatus 100 and the transmitting apparatus is a strong electric field. Meanwhile, in a case where the estimated value Pr of the electric power of the quantized received signal measured in Step S51 is smaller than the strong electric field threshold value Pr_th, the reception intensity of the communication path between the receiving apparatus 100 and the transmitting apparatus is not a strong electric field but a medium electric field or a weak electric field. Note that the strong electric field threshold value Pr_th is, for example, electric power at which the SNR of the quantized received signal becomes approximately 10 [dB], but is not limited.

In a case where the gain search range setting section 109 determines that the estimated value Pr of the electric power of the quantized received signal measured in Step S51 is larger than the strong electric field threshold value Pr_th (NO in S54), the gain search range setting section 109 determines that a reception error of the header information is not detected and the reception intensity of the communication path between the receiving apparatus 100 and the transmitting apparatus is a strong electric field because the estimated value Pr of the electric power is larger than the strong electric field threshold value Pr_th, and widens the gain search range of the combined gain G in the AGC process (S55). After Step S55, the gain search range setting section 109 finishes the process for setting the gain search range for a signal received for the second or subsequent time.

Meanwhile, in a case where the gain search range setting section 109 determines that the estimated value Pr of the electric power of the quantized received signal measured in Step S51 is smaller than the strong electric field threshold value Pr_th (YES in S54), the gain search range setting section 109 determines that a reception error of the header information is not detected, but the reception intensity of the communication path between the receiving apparatus 100 and the transmitting apparatus is a medium electric field because the estimated value Pr of the electric power is smaller than the strong electric field threshold value Pr_th, and maintains, that is, does not change the current gain search range of the combined gain G in the AGC process (S56). After Step S56, the gain search range setting section 109 finishes the process for setting the gain search range for a signal received for the second or subsequent time.

In a case where the gain search range setting section 109 determines that a reception error for the header information has been detected (YES in S53), the gain search range setting section 109 determines whether or not the estimated value Pr of the electric power of the quantized received signal measured in Step S51 is smaller than the predetermined strong electric field threshold value Pr_th (S57).

In a case where the gain search range setting section 109 determines that the estimated value Pr of the electric power of the quantized received signal measured in Step S51 is larger than the predetermined strong electric field threshold value Pr_th (NO in S57), the gain search range setting section 109 determines that a reception error of the header information is detected, but the reception intensity of the communication path between the receiving apparatus 100 and the transmitting apparatus is a strong electric field because the estimated value Pr of the electric power is larger than the strong electric field threshold value Pr_th, and widens the gain search range of the combined gain G in the AGC process (S58). After Step S58, the gain search range setting section 109 finishes the process for setting the gain search range for a signal received for the second or subsequent time.

Meanwhile, in a case where the gain search range setting section 109 determines that the estimated value Pr of the electric power of the quantized received signal measured in Step S51 is smaller than the predetermined strong electric field threshold value Pr_th (YES in S57), the gain search range setting section 109 determines that a reception error of the header information is detected and furthermore the reception intensity of the communication path between the receiving apparatus 100 and the transmitting apparatus is a weak electric field because the estimated value Pr of the electric power is smaller than the strong electric field threshold value Pr_th, and narrows the gain search range of the combined gain G in the AGC process (S59). After Step S59, the gain search range setting section 109 finishes the process for setting the gain search range for a signal received for the second or subsequent time. Note that the gain search range determined in FIG. 10 is effective for a next received signal (packet).

The first error correction code that has high error correction capability is added to the header HED of the signal (packet) transmitted by the transmitting apparatus. Accordingly, it is considered that a reception error caused by external noise is unlikely to occur. That is, in a case where a reception error is detected in the header information stored in the header HED, there is a possibility that convergence of the AGC process within a specified period of time is difficult and therefore a start timing of demodulation in the demodulating section 112 is delayed.

Therefore, in a case where the gain search range setting section 109 determines in Step S53 that a reception error of the header information has occurred and determines in Step S51 that the estimated value Pr of the electric power is smaller than the strong electric field threshold value Pr_th, the gain search range setting section 109 narrows the gain search range of the combined gain G in the AGC process. This allows the gain-determining section 110 to shorten a convergence time of the AGC process. It is therefore possible to suppress occurrence of delay of the start of demodulation in the demodulating section 112.

In a case where the gain search range setting section 109 determines in Step S53 that no reception error of the header information has occurred and determines in Step S51 that the estimated value Pr of the electric power is smaller than the strong electric field threshold value Pr_th, the gain search range setting section 109 maintains the current gain search range of the combined gain G in the AGC process.

Therefore, in a case where a reception error of header information is detected in a previously received packet, the gain search range setting section 109 can store information indicating that the gain search range of the combined gain G in the AGC process has been narrowed. In a case where a reception error of header information is not detected in a previously received packet, the gain search range setting section 109 can continuously use a gain search range used for the previously received packet.

In a case where the communication path between the receiving apparatus 100 and the transmitting apparatus is a strong electric field, the accuracy of estimation of the estimated value Pr of the electric power in the electric power estimating section 111 is high, but in a case where the communication path between the receiving apparatus 100 and the transmitting apparatus is not a strong electric field, the accuracy of estimation of the estimated value Pr of the electric power in the electric power estimating section 111 is low. In a case where the accuracy of estimation of the estimated value Pr of the electric power is low, a variation occurs in estimated value of the electric power of the received signal before quantization estimated by the electric power estimating section 111.

Therefore, in a case where the gain search range setting section 109 determines that the communication path between the receiving apparatus 100 and the transmitting apparatus is a strong electric field, the gain search range setting section 109 widens the gain search range of the combined gain G in the AGC process irrespective of presence or absence of a reception error of header information in the error detecting section 114. In this way, the gain search range setting section 109 can appropriately determine the gain search range of the combined gain G in the AGC process even in a case where the transmitting apparatus which is a communication partner of the receiving apparatus 100 has moved or in a case where the communication partner of the receiving apparatus 100 has switched to another one.

Although an error correction code that has higher capability than that of the other data is added to the header HED of the signal (packet) transmitted by the transmitting apparatus, the probability of occurrence of an error by external noise is not zero. Accordingly, even in a case where a reception error of header information is detected, the gain search range setting section 109 can determine that the reception error is due to external noise in a case where the estimated value Pr of the electric power before quantization is a strong electric field that exceeds the strong electric field threshold value Pr_th. This allows the gain search range setting section 109 to avoid an unnecessary change of the gain search range of the combined gain G in the AGC process.

Table 2 shows a result of detection of presence/absence of a reception error of header information in the error detecting section 114 and the gain search range of the combined gain G in the AGC process that corresponds to an estimated value Pr of the electric power of the received signal before quantization in the electric power estimating section 111.

TABLE 2

| estimated value Pr of electric power | Reception error | |
|---|---|---|
| | Detected | Not detected |
| Equal to or larger than strong electric field threshold value | widen | widen |
| Smaller than strong electric field threshold value | narrow | maintain |

FIG. 11 is a timing chart illustrating signal detection operations in the cases of a strong electric field, a medium electric field, and a weak electric field in the chronological order in a conventional art. FIG. 12 is a timing chart illustrating a signal detection operation in the case of a strong electric field in the chronological order in the receiving apparatus 100 of the present embodiment. FIG. 13 is a timing chart illustrating a signal detection operation in the case of a medium electric field in the chronological order in the receiving apparatus 100 of the present embodiment. FIG. 14 is a timing chart illustrating a signal detection operation in the case of a weak electric field in the chronological order in the receiving apparatus 100 of the present embodiment.

In FIGS. 11 to 14, a time t0 is a time at which the first known sequence (the training sequence A1) of the preamble PRB is received by the receiving apparatus, and a time t1 is a time at which the last known sequence (the training sequence AN) of the preamble PRB is received by the receiving apparatus. In FIGS. 11 to 14, the receiving apparatus need converge the AGC process by the time t1, and in a case where convergence of the AGC process by the time t1 is difficult, the start of demodulation is delayed.

In FIG. 11, the gain search range in the AGC process is wide irrespective of whether the communication path between the receiving apparatus and the transmitting apparatus is a strong electric field, a medium electric field, or a weak electric field. Therefore, in the case of a strong electric field, the AGC process converges by the time t1, but in the cases of a medium electric field and a weak electric field, the AGC process does not converge by the time t1. This delays the start of demodulation, and therefore a reception error of an information bit is detected.

Communication Path in First Communication Between Receiving Apparatus 100 and Transmitting Apparatus: Strong Electric Field In FIG. 12, in a case where a communication path at the first communication between the receiving apparatus 100 and the transmitting apparatus is a strong electric field, a time point at which a signal is detected by electric power detection is earlier than a time point at which a signal is detected by correlation detection, and therefore the gain search range setting section 109 widens the gain search range. Furthermore, the gain-determining section 110 can converge the AGC process by the time t1. Moreover, the estimated value Pr of the electric power of the signal before quantization estimated by the electric power estimating section 111 exceeds the strong electric field threshold value Pr_th, demodulation of the signal in the demodulating section 112 is executed without an error, and the information bit IBT is correctly restored. Therefore, the gain search range setting section 109 widens the gain search range of the combined gain G of AGC for a signal (packet) received next.

In a case where the receiving apparatus 100 receives the second or subsequent signal transmitted by the identical transmitting apparatus, the operation of the receiving apparatus 100 is similar to that described above as long as the communication path between the receiving apparatus 100 and the transmitting apparatus is a strong electric field, and therefore is not explained repeatedly. The gain search range setting section 109 widens the gain search range of the combined gain G of AGC for a signal (packet) received next.

Here, in a case where the communication partner (the transmitting apparatus) of the receiving apparatus 100 changes and the communication path between a new communication partner (another transmitting apparatus) and the receiving apparatus 100 becomes a medium electric field, a time point at which a signal is detected by electric power detection becomes similar to a time point at which a signal is detected by correlation detection.

However, since the gain search range of the combined gain G in AGC is set wide in the past communication, convergence of the AGC process by the time t1 in the gain-determining section 110 is difficult, and the AGC process does not converge within a specified period of time. This delays the start of demodulation in the demodulating section 112, and therefore a reception error of header information is detected. Note that since the AGC process does not converge within the specified period of time, it becomes difficult for the receiving apparatus 100 to transmit reception response (Ack: Acknowledgment), and therefore the transmitting apparatus retransmits an identical packet to the receiving apparatus 100.

Furthermore, since the estimated value Pr of the electric power of the signal before quantization estimated by the electric power estimating section 111 does not exceed the strong electric field threshold value Pr_th, the gain search range setting section 109 determines that the communication path between the receiving apparatus 100 and the transmitting apparatus is not a strong electric field, and narrows the gain search range of the combined gain G in AGC in preparation for a next received signal (packet). The case where the communication partner (the transmitting apparatus) of the receiving apparatus 100 changes and a communication path between the new communication partner (another transmitting apparatus) and the receiving apparatus 100 becomes a weak electric field will be described later with reference to FIG. 14.

Communication Path in First Communication Between Receiving Apparatus 100 and Transmitting Apparatus: Medium Electric Field In FIG. 13, in a case where a communication path in the first communication between the receiving apparatus 100 and the transmitting apparatus is a medium electric field, a time point at which a signal is detected by electric power detection is earlier than a time point at which a signal is detected by correlation detection, and the gain search range setting section 109 widens a gain search range. However, since a start timing of the AGC process in the gain-determining section 110 becomes later than that in a case where the communication path between the receiving apparatus 100 and the transmitting apparatus is a strong electric field, convergence of the AGC process by the time t1 is difficult, and therefore the start of demodulation in the demodulating section 112 is delayed. Since the estimated value Pr of the electric power of the signal before quantization in the electric power estimating section 111 is less than the strong electric field threshold value Pr_th, the gain search range setting section 109 narrows the gain search range of the combined gain G in AGC.

In the second or subsequent communication between the receiving apparatus 100 and the transmitting apparatus, the AGC process in the gain-determining section 110 converges by the time t1 since the gain search range is set narrow in the first communication. This allows the demodulating section 112 to start demodulation from the time t1, and therefore a reception error of header information is not detected. However, since the estimated value Pr of the electric power of the signal before quantization in the electric power estimating section 111 is less than the strong electric field threshold value Pr_th, the gain search range setting section 109 maintains, that is, does not change the current gain search range of the combined gain G in AGC. That is, the gain search range setting section 109 maintains a state where the gain search range of the combined gain G in AGC has been narrowed.

Here, in a case where the communication partner (the transmitting apparatus) of the receiving apparatus 100 switches to another one and a communication path between the new communication partner (another transmitting apparatus) and the receiving apparatus 100 becomes a strong electric field, a time point at which a signal is detected by electric power detection is earlier than a time point at which a signal is detected by correlation detection. However, since the gain search range is set narrow in the past communication, convergence of the AGC process within a specified period of time in the gain-determining section 110 is difficult, and therefore the AGC process is forcibly finished. In this case, the received signal quantized by the analog-to-digital converting section 104 is in a saturated state.

However, the estimated value Pr of the electric power of the signal before quantization in the electric power estimating section 111 exceeds the strong electric field threshold value Pr_th although a reception error of header information is not detected. Therefore, the gain search range setting section 109 widens the gain search range of the combined gain G in AGC for a signal (packet) received next. Note that in a case where the communication partner (the transmitting apparatus) of the receiving apparatus 100 switches to another one and a communication path between the new communication partner (another transmitting apparatus) and the receiving apparatus 100 becomes a weak electric field, the receiving apparatus 100 operates in a similar way. Specifically, the gain search range setting section 109 narrows the gain search range of the combined gain G in AGC for a signal (packet) received next as in the past communication. Therefore, the operation of the receiving apparatus 100 is not explained repeatedly.

Communication Path in First Communication Between Receiving Apparatus 100 and Transmitting Apparatus: Weak Electric Field In FIG. 14, in a case where a communication path at the first communication between the receiving apparatus 100 and the transmitting apparatus is a weak electric field, a time point at which a signal is detected by correlation detection is earlier than a time point at which a signal is detected by electric power detection, and the gain search range setting section 109 narrows the gain search range. Furthermore, the gain-determining section 110 can converge the AGC process by the time t1. The estimated value Pr of the electric power of the signal before quantization estimated by the electric power estimating section 111 is less than the strong electric field threshold value Pr_th, but the signal is demodulated without an error in the demodulating section 112, and the information bit IBT is correctly restored. Therefore, the gain search range setting section 109 narrows the gain search range of the combined gain G in AGC for a signal (packet) received next.

Also in the second or subsequent communication between the receiving apparatus 100 and the transmitting apparatus, the receiving apparatus 100 operates in a similar way as long as the communication path between the receiving apparatus 100 and the transmitting apparatus is a weak electric field, and therefore the operation of the receiving apparatus 100 is not explained repeatedly. The gain search range setting section 109 narrows the gain search range of the combined gain G in AGC for a signal (packet) received next.

Here, in a case where the communication partner (the transmitting apparatus) of the receiving apparatus 100 switches to another one and a communication path between the new communication partner (another transmitting apparatus) and the receiving apparatus 100 becomes a strong electric field, a time point at which a signal is detected by electric power detection is earlier than a time point at which a signal is detected by correlation detection. However, since the gain search range is set narrow in the past communication, convergence of the AGC process within a specified period of time in the gain-determining section 110 is difficult, and therefore the AGC process is forcibly finished. In this case, the received signal quantized by the analog-to-digital converting section 104 is in a saturated state.

However, the estimated value Pr of the electric power of the signal before quantization in the electric power estimating section 111 exceeds the strong electric field threshold value Pr_th although a reception error of header information is not detected. Therefore, the gain search range setting section 109 widens the gain search range of the combined gain G in AGC for a signal (packet) received next.

Note that in a case where the communication partner (the transmitting apparatus) of the receiving apparatus 100 switches to another one and a communication path between the new communication partner (another transmitting apparatus) and the receiving apparatus 100 becomes a medium electric field, the receiving apparatus 100 operates in a similar way. Specifically, the gain search range setting section 109 narrows the gain search range of the combined gain G in AGC for a signal (packet) received next as in the past communication. Therefore, the operation of the receiving apparatus 100 is not explained repeatedly.

As described above, the receiving apparatus 100 of the present embodiment widens, maintains, or narrows the gain search range of the combined gain G in the AGC process for a signal (packet) received next by using the estimated value Pr of the electric power of the received signal before quantization received by the receiving antenna Ant and a detection result of a reception error of header information stored in the header HED of the quantized received signal.

This allows the receiving apparatus 100 to adaptively adjust the gain search range of the combined gain G in the AGC process for a signal (packet) received next by using the estimated value Pr of the electric power of the received signal before quantization received by the receiving antenna Ant and a detection result of a reception error of header information stored in the header HED of the quantized received signal, even in a case where the communication partner (the transmitting apparatus) of the receiving apparatus 100 has moved or has switched to another communication partner (another transmitting apparatus).

Accordingly, the receiving apparatus 100 can converge the AGC process in the gain-determining section 110 within a predetermined specified period of time and suppress occurrence of a reception error of header information irrespective of whether a communication path between the receiving apparatus 100 and the communication partner (the transmitting apparatus) is a strong electric field, a medium electric field, or a weak electric field. It is therefore possible to suppress a deterioration of the accuracy of detection of a received signal.

Furthermore, the receiving apparatus 100 changes the gain search range in the gain search range setting section 109, but does not change the standby gain Gs set in the standby gain setting section 108. Accordingly, even in a case where the receiving apparatus 100 communicates with a plurality of transmitting apparatuses that have different distances from the receiving apparatus 100 and the amount of attenuation of signal transmission that occurs due to switching of a communication partner changes, the receiving apparatus 100 can accurately detect a signal transmitted by the communication partner.

The embodiment has been described so far. However, needless to say, the present disclosure is not limited to this example. It is apparent that a person skilled in the art can arrive at various changes and modifications within the scope of the claims, and it is understood that such changes and modifications belong to the technical scope of the present disclosure.

In the present embodiment described above, an example in which the receiving apparatus 100 is, for example, realized by a hardware resource has been described. However, part of the receiving apparatus 100 may be realized by software that works in cooperation with a hardware resource.

The sections (constituent elements) of the receiving apparatus 100 of the present embodiment described above are typically realized as an LSI (Large Scale Integration), which is an integrated circuit. These constituent elements may be individually chipped or part or all of the constituent elements may be collectively chipped. Here, the term "LSI" is used, but terms "IC (Integrated Circuit)", "system LSI", "super LSI", and "ultra LSI" may be used depending on the degree of integration.

Furthermore, a method for realizing the integrated circuit is not limited to LSI, but the integrated circuit may be realized by a dedicated circuit or a general-purpose processor. An FPGA (Field Programmable Gate Array) that can be programmed after production of an LSI or a reconfigurable processor in which connection and settings of a circuit cell in the LSI can be reconfigured may be used.

Furthermore, if other techniques for achieving an integrated circuit that take the place of LSI appear as a result of the progress or derivation of the semiconductor technique, it is of course possible to realize integration of the sections of the receiving apparatus 100 by using such other techniques. One possibility is application of a biotechnology etc.

The present disclosure is useful as a receiving apparatus that can suppress a deterioration of the accuracy of detection of a received signal by increasing the speed of convergence of AGC irrespective of change or movement of a communication partner.

What is claimed is:

1. A receiving apparatus that receives a signal via a receiving antenna and quantizes the received signal, comprising:
   a gain controller that adjusts gain in the receiving apparatus in accordance with electric power of the quantized received signal;
   an electric power estimator that estimates electric power of the received signal before quantization on the basis of the electric power of the quantized received signal and the gain in the receiving apparatus; and
   an error detector that detects a reception error in a predetermined region of the quantized received signal, wherein
   the gain controller adjusts a search range for the gain on the basis of a result of detection of the reception error in the predetermined region of the quantized received signal and an electric power estimated value of the received signal before quantization.

2. The receiving apparatus according to claim 1, further comprising a signal detector that determines detection of the received signal on the basis of the electric power of the quantized received signal or a correlation between the received signal before quantization and a predetermined known sequence.

3. The receiving apparatus according to claim 1, wherein the gain controller widens the search range for the gain in a case where a reception error in a header region of the quantized received signal is not detected and the electric power estimated value of the received signal before quantization exceeds a predetermined second threshold value.

4. The receiving apparatus according to claim 1, wherein the gain controller widens the search range for the gain in a case where a reception error in a header region of the quantized received signal is detected and the electric power estimated value of the received signal before quantization exceeds a predetermined second threshold value.

5. The receiving apparatus according to claim 1, wherein the gain controller does not change the search range for the gain in a case where a reception error in a header region of the quantized received signal is not detected and the electric power estimated value of the received signal before quantization is less than a predetermined second threshold value.

6. The receiving apparatus according to claim 1, wherein the gain controller narrows the search range for the gain in a case where a reception error in a header region of the quantized received signal is detected and the electric power estimated value of the received signal before quantization is less than a predetermined second threshold value.

7. The receiving apparatus according to claim 2, wherein the gain controller widens the search range for the gain in a case where the electric power of the quantized initially received signal exceeds a predetermined first threshold value before detection of a peak of the correlation between the initially received signal and the predetermined known sequence after activation of the receiving apparatus.

8. The receiving apparatus according to claim 2, wherein the gain controller narrows the search range for the gain in a case where a peak of the correlation between the initially received signal and the predetermined known sequence is detected before the electric power of the quantized initially received signal exceeds a predetermined first threshold value after activation of the receiving apparatus.

* * * * *